(12) United States Patent
Gouchi et al.

(10) Patent No.: US 9,225,064 B2
(45) Date of Patent: Dec. 29, 2015

(54) ANTENNA DEVICE, WIRELESS COMMUNICATION DEVICE, AND METHOD OF MANUFACTURING ANTENNA DEVICE

(71) Applicant: Murata Manufacturing Co., Ltd., Nagaokakyo-shi, Kyoto-fu (JP)

(72) Inventors: Naoki Gouchi, Nagaokakyo (JP); Nobuo Ikemoto, Nagaokakyo (JP); Kuniaki Yosui, Nagaokakyo (JP); Wataru Tamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 233 days.

(21) Appl. No.: 13/959,968

(22) Filed: Aug. 6, 2013

(65) Prior Publication Data

US 2014/0043196 A1 Feb. 13, 2014

(30) Foreign Application Priority Data

Aug. 9, 2012 (JP) ................. 2012-176950
Jan. 22, 2013 (JP) ................. 2013-008873
Jul. 22, 2013 (JP) ................. 2013-151274

(51) Int. Cl.
*H01Q 7/08* (2006.01)
*H01Q 1/36* (2006.01)
*H01Q 7/06* (2006.01)
*H01Q 1/22* (2006.01)
*H01Q 1/24* (2006.01)

(52) U.S. Cl.
CPC ............... *H01Q 7/06* (2013.01); *H01Q 1/2225* (2013.01); *H01Q 1/243* (2013.01); *H01Q 7/08* (2013.01); *Y10T 29/49016* (2015.01)

(58) Field of Classification Search
USPC .................................................. 343/788, 895
See application file for complete search history.

(56) References Cited

U.S. PATENT DOCUMENTS

| | | | |
|---|---|---|---|
| 6,222,489 B1 * | 4/2001 | Tsuru et al. | 343/700 MS |
| 7,098,858 B2 * | 8/2006 | Bittar et al. | 343/719 |
| 2004/0124961 A1 | 7/2004 | Aoyagi | |

(Continued)

FOREIGN PATENT DOCUMENTS

| | | |
|---|---|---|
| GB | 1218681 A | 1/1971 |
| GB | 2461443 A | 1/2010 |

(Continued)

OTHER PUBLICATIONS

Official Communication issued in corresponding European Patent Application No. 13179739.1, mailed on Jan. 7, 2014.

*Primary Examiner* — Tan Ho
(74) *Attorney, Agent, or Firm* — Keating & Bennett, LLP

(57) ABSTRACT

In an antenna device, first linear portions of a coil conductor are located on a lower surface of a first resin sheet. Second linear portions of the coil conductor are located on an upper surface of a second resin sheet. Via conductors of the coil conductor are formed in the first and second resin sheets and intermediate resin sheets located between the first and second resin sheets. The via conductors connect a first end and a second end of the first linear portions and a first end and a second end of the second linear portions, respectively. The first and second linear portions and the via conductors define the coil conductor. Each of the intermediate resin sheets includes an aperture in the center portion thereof. The lamination of the apertures defines a cavity in which a magnetic substance core is embedded. The coil conductor is wound around a periphery of the cavity.

20 Claims, 35 Drawing Sheets

(56) References Cited

U.S. PATENT DOCUMENTS

2006/0262030 A1* 11/2006 Bae et al. .................. 343/895
2012/0154252 A1* 6/2012 Nakatani .................. 343/895
2014/0266551 A1* 9/2014 Yokoyama ................ 336/200

FOREIGN PATENT DOCUMENTS

| | | |
|---|---|---|
| JP | 2005-184094 A | 7/2005 |
| JP | 4821965 B2 | 11/2011 |
| WO | 2011/108340 A1 | 9/2011 |

* cited by examiner

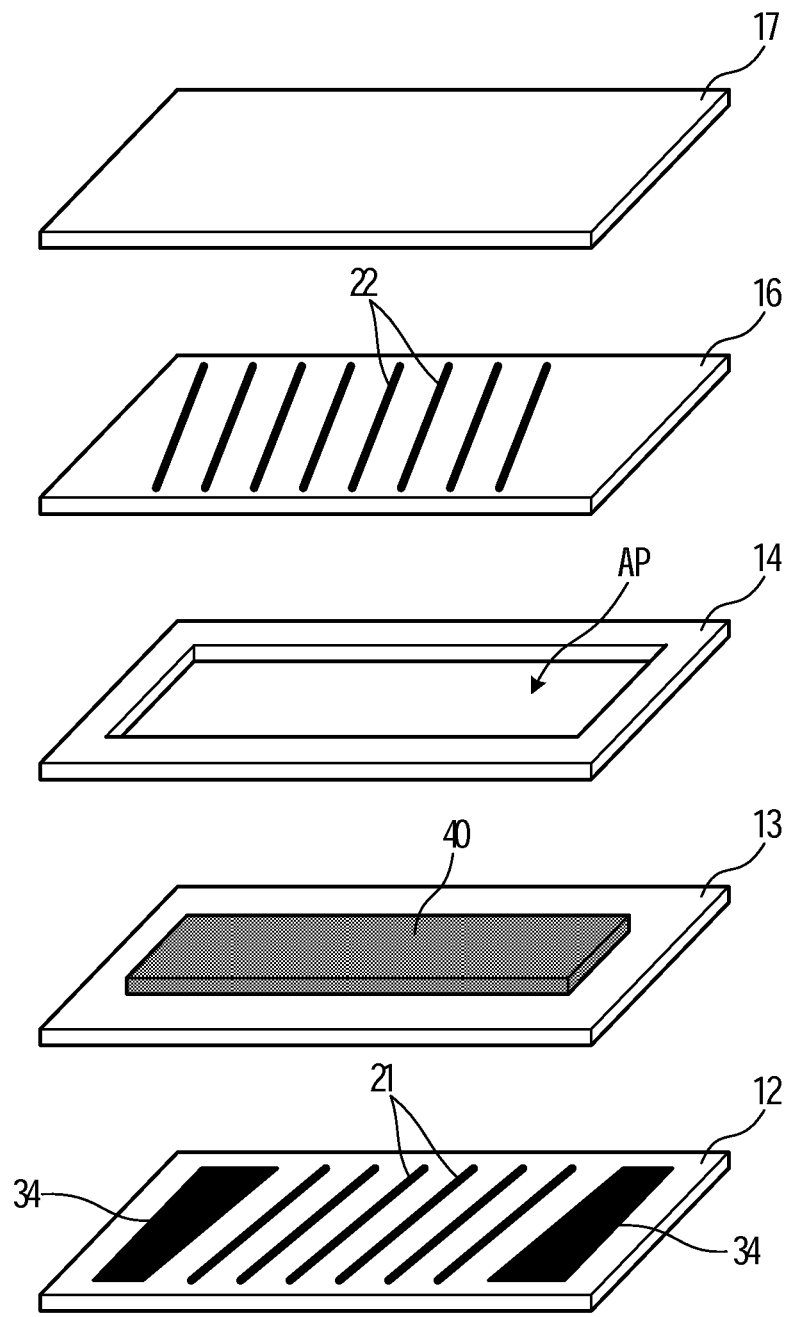

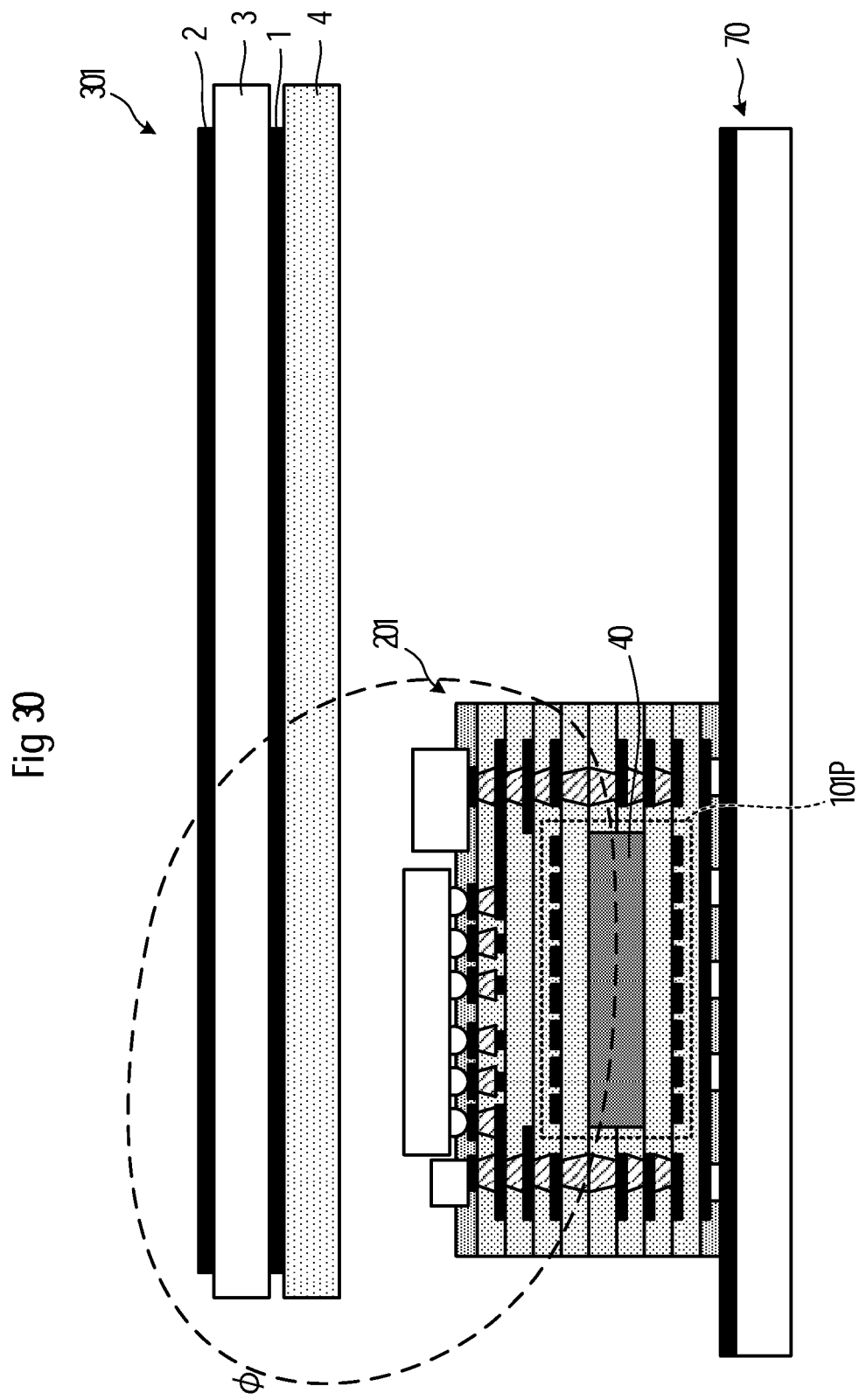

ANTENNA DEVICE, WIRELESS COMMUNICATION DEVICE, AND METHOD OF MANUFACTURING ANTENNA DEVICE

This non-provisional application claims priority under 35 U.S.C. §119(a) to Patent Application No. 2012-176950 filed in Japan on Aug. 9, 2012, and Patent Application No. 2013-008873 filed in Japan on Jan. 22, 2013, the entire contents of which are hereby incorporated by reference.

BACKGROUND OF THE INVENTION

1. Field of the Invention

The present invention relates to an antenna device that includes a magnetic substance and a coil conductor, a wireless communication device that includes the antenna device, and a method of manufacturing the antenna device.

2. Description of the Related Art

Japanese Patent No. 4821965 discloses an antenna device having a layered structure in order to realize in a small area an antenna equipped with a magnetic substance, the antenna device performing short-range wireless communication such as Near Field Communication (NFC). By using such a layered structure, the aperture diameter of an antenna coil can be changed only by varying the number of layers, and a coil conductor surface and a surface on which a circuit board is mounted can be arranged to overlap with each other in a plan view, which leads to various advantages such as space saving.

However, in order to manufacture the antenna device having a multilayer structure as disclosed in Japanese Patent No. 4821965, it is necessary to laminate a sheet obtained by mixing magnetic filler with a binder and printing an electrode on the sheet, and co-firing of the sheets integrally. While the sintering temperature of the magnetic substance is not less than 1000° C., however, the firing temperature of silver is approximately 800° C. to 900° C., so that the firing temperature cannot be set to a high temperature of 900° C. or higher. As a result, the magnetic substance is not sintered completely and cannot obtain a favorable material characteristic (a high permeability and a low magnetic loss characteristic), which has been a factor in not being able to obtain a favorable antenna characteristic.

SUMMARY OF THE INVENTION

In view of the foregoing, preferred embodiments of the present invention provide an antenna device capable of obtaining a favorable antenna characteristic while saving space, a wireless communication device including the antenna device, and a method of manufacturing the antenna device.

An antenna device according to a preferred embodiment of the present invention includes a resin multilayer substrate in which a plurality of resin sheets are laminated to one another; and a coil conductor located on the resin multilayer substrate, wherein the resin multilayer substrate includes a cavity inside of the resin multilayer substrate; the coil conductor is wound around a periphery of the cavity, and the cavity includes a magnetic substance of a sintered body (a sintered magnetic substance) arranged inside the cavity.

This configuration makes it possible to use the magnetic substance that is sintered completely, to utilize a favorable material characteristic (a high permeability and a low magnetic loss characteristic), and to obtain a favorable antenna characteristic.

As necessary, the resin multilayer substrate may preferably include a plurality of the cavities inside of the resin multilayer substrate and each of the cavities may preferably include the magnetic substance. As a result of this arrangement, the degree of freedom of a positional relationship between the coil conductor and the magnetic substance can be enhanced.

The magnetic substance may preferably have a flat plate shape, and a (two-dimensionally extending) first conductor pattern other than the coil conductor may preferably be arranged in a position in which at least a portion of at least one of surfaces of the magnetic substance is covered. This makes the resin sheet and the resin multilayer substrate reinforced and makes the magnetic substance more resistant to breakage at a time of compression bonding (at a time of press molding) the resin sheets.

The plurality of resin sheets may preferably include a resin sheet between the first conductor pattern and the coil conductor, and the resin sheet may preferably have a dielectric constant that is lower than a dielectric constant of the resin sheet on which the coil conductor is provided and a dielectric constant of the magnetic substance.

The magnetic substance may preferably be have a rectangular or substantially rectangular plate shape and may preferably include a second conductor pattern arranged in a position in which the second conductor pattern overlaps a short side of the magnetic substance. Thus, the displacement of the short side of the magnetic substance is effectively prevented or significantly reduced, and stress to the magnetic substance is prevented or significantly reduced.

The coil conductor may preferably include a plurality of linear conductors located on a surface of the resin sheet in different layers; and an interlayer connection conductor that connects the linear conductors between the layers, and the second conductor pattern may preferably be a portion of the linear conductors.

The interlayer connection conductor of the resin multilayer substrate may preferably be arranged in a periphery of the magnetic substance in a plan view. Accordingly, the interlayer connection conductor suppresses resin fluidity at a time of compression bonding the plurality of resin sheets, which prevents the magnetic substance from being displaced in the resin multilayer substrate.

The resin sheet with which the magnetic substance is temporarily compression bonded before the plurality of resin sheets are laminated may preferably include no coil conductor in a position in which the resin sheet overlaps the magnetic substance in a plan view. This makes the magnetic substance more resistant to breakage when the resin sheet and the magnetic substance are temporarily compression bonded with each other.

Of the plurality of resin sheets, the resin sheet of a layer including the cavity may preferably be a sheet including a magnetic substance. This prevents or significantly reduces a change in characteristics since the overall shape of the magnetic substance is not substantially changed even when the magnetic substance is displaced in the resin multilayer substrate.

The coil conductor may preferably include a plurality of linear conductors located on a surface of the resin sheet in different layers; and an interlayer connection conductor that connects the linear conductors between the layers; the linear conductors may preferably be arranged so as to cross the magnetic substance in a plan view, and a portion that is included in the resin sheet and is adjacent to the linear conductor may preferably be bent in a corrugated plate shape. This makes the resin sheet and the resin multilayer substrate reinforced and prevents breakage of the magnetic substance at a time of compression bonding (at a time of press molding) the resin sheets.

As necessary, the resin multilayer substrate may preferably include a chip element connected to the coil conductor and the chip element may preferably be mounted on at least one of principal surfaces of the resin multilayer substrate. This makes it possible to form a module equipped with an antenna.

As necessary, the antenna device may preferably include a coil (a booster coil) that is electromagnetically coupled to the coil conductor and radiates an electromagnetic field. This can improve antenna gain and control antenna directivity.

A wireless communication device according to a preferred embodiment of the present invention includes an antenna device including a resin multilayer substrate in which a plurality of resin sheets are laminated to one another; and a coil conductor located on the resin multilayer substrate, wherein the resin multilayer substrate includes a cavity inside of the resin multilayer substrate; the coil conductor is wound around a periphery of the cavity, and the cavity includes a sintered magnetic substance arranged inside the cavity, and a communication circuit connected to the coil conductor.

With this configuration, the wireless communication device includes an antenna device having a favorable antenna characteristic, a low loss characteristic, and a longer maximum communicable distance.

A method of manufacturing an antenna device according to a preferred embodiment of the present invention is a method of manufacturing an antenna device including a resin multilayer substrate in which a plurality of resin sheets are laminated to one another; and a coil conductor located on the resin multilayer substrate, the method of manufacturing an antenna device including the steps of: forming the coil conductor on the resin sheet; forming an aperture for forming a cavity in the resin sheet; forming the cavity by forming a plurality of the apertures laminated by laminating, among the plurality of resin sheets, a resin sheet in which the aperture is formed and a resin sheet in which no aperture is formed, storing in the cavity a magnetic substance of a sintered body having an outer dimension smaller than an inner dimension of the cavity, and compression bonding the plurality of resin sheets together with the magnetic substance.

According to this manufacturing method, a load applied by the resin sheet to the magnetic substance is small, so that breakage of the magnetic substance is prevented or significantly reduced.

The method of manufacturing an antenna device may preferably further include a step of arranging the magnetic substance on the resin sheet in which no aperture is formed and temporarily compression bonding the resin sheet and the magnetic substance before the step of compression bonding the plurality of resin sheets. This makes it easier to embed the magnetic substance in the resin multilayer substrate.

The resin sheet with which the magnetic substance is temporarily compression bonded before the plurality of resin sheets are laminated may preferably include no coil conductor in a position in which the resin sheet overlaps the magnetic substance in a plan view. This prevents breakage of the magnetic substance when the resin sheet and the magnetic substance are temporarily compression bonded with each other.

With the antenna devices according to various preferred embodiments of the present invention, a magnetic substance that is completely sintered is used, a favorable material characteristic (a high permeability and a low magnetic loss characteristic) is utilized, so that a favorable antenna characteristic is obtained.

In addition, with the wireless communication device according to the various preferred embodiments of the present invention, a low loss characteristic and an increase in maximum communicable distance is achieved.

Moreover, with the method of manufacturing an antenna device according to the various preferred embodiments of the present invention, a load applied by the resin sheet to the magnetic substance is small, so that an efficiency percentage is improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 22A is a cross-sectional view of a resin sheet 13 and a magnetic substance core 40, FIG. 22B is a cross-sectional view in a state in which the magnetic substance core 40 is temporarily compression bonded with the resin sheet 13, and FIG. 22C is a cross-sectional view showing a state in which a plurality of resin sheets are laminated, the resin sheets including the resin sheet 13, as shown in FIG. 22B, with which the magnetic substance core 40 is temporarily compression bonded.

FIG. 23 is an exploded perspective view of an antenna device 108 according to an eighth preferred embodiment of the present invention.

FIG. 30 is a cross-sectional view of a main portion of an antenna device according to an eleventh preferred embodiment of the present invention.

DETAILED DESCRIPTION OF THE PREFERRED EMBODIMENTS

First Preferred Embodiment

Figure 1:
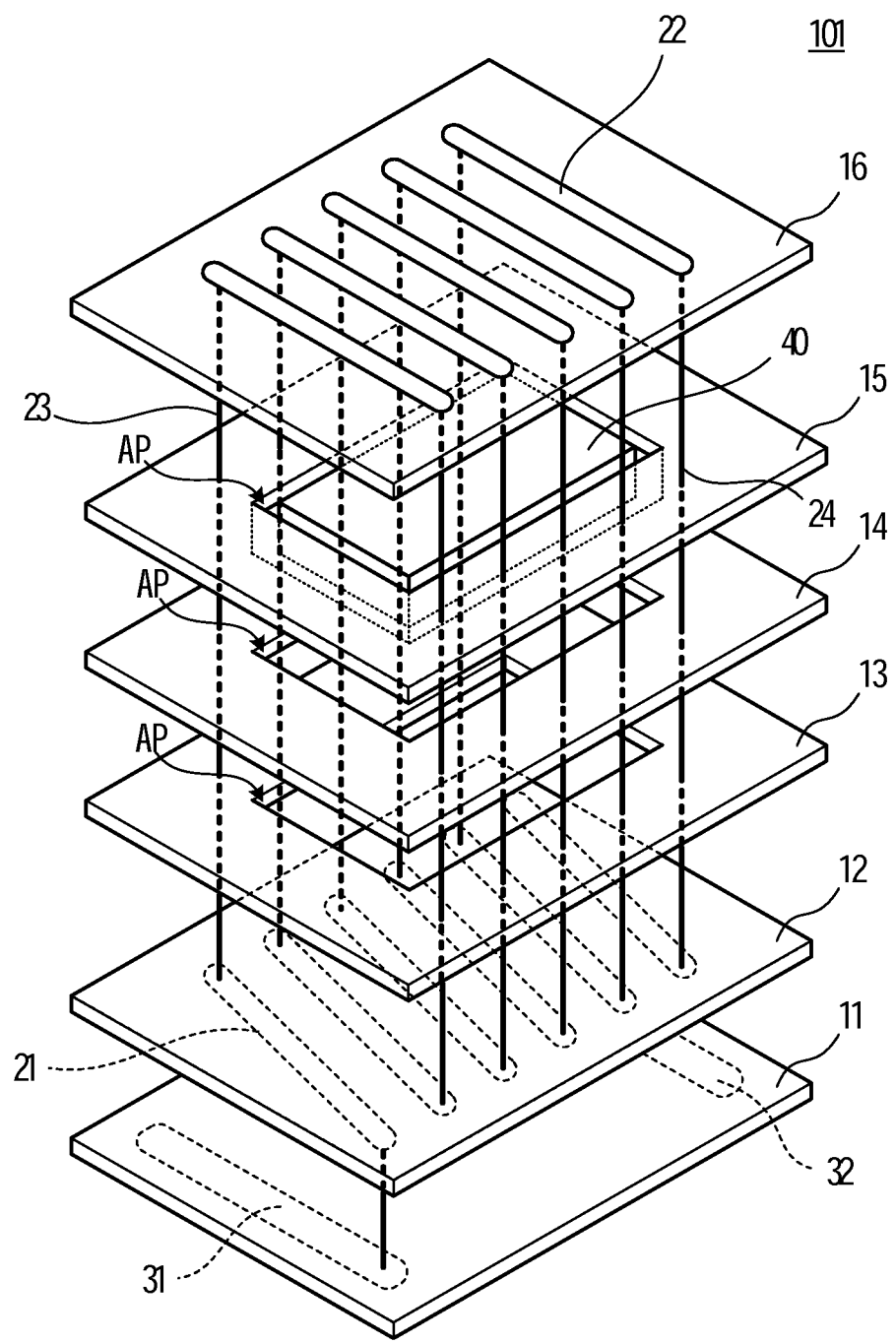
FIG. 1 is an exploded perspective view of an antenna device 101 according to a first preferred embodiment of the present invention.
Figure 2:
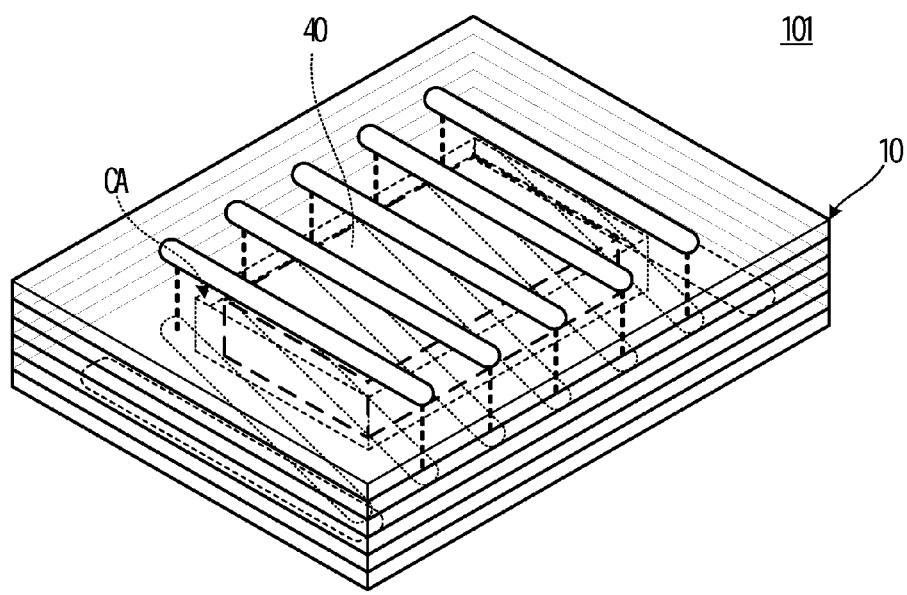
FIG. 2 is a perspective view of the antenna device 101.
Figure 3A:
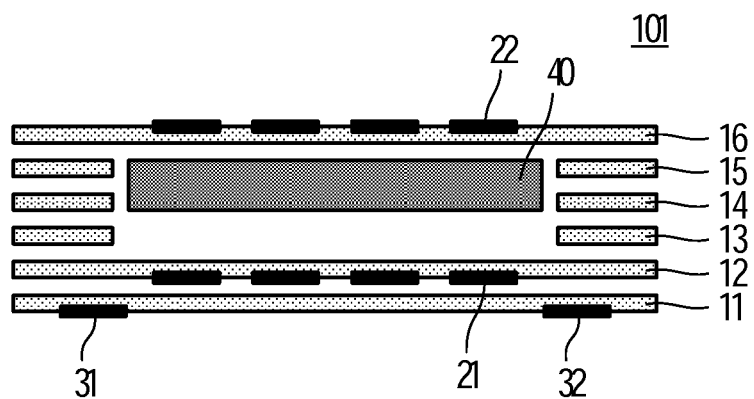
FIG. 3A is an exploded cross-sectional view of a main portion of the antenna device 101 and FIG. 3B is a cross-sectional view of the main portion of the antenna device 101.
Figure 3B:
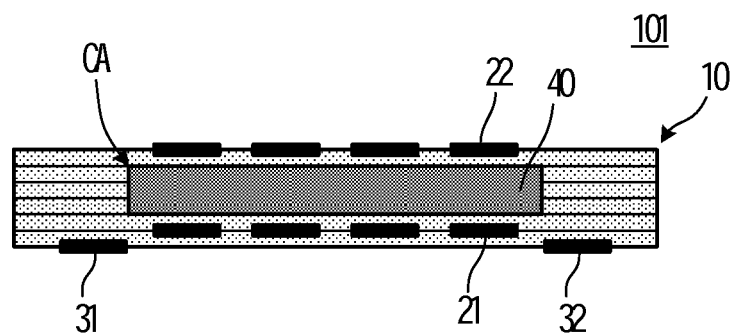

FIG. 1 is an exploded perspective view of an antenna device 101 according to a first preferred embodiment of the present invention. FIG. 2 is a perspective view of the antenna device 101. FIG. 3A is an exploded cross-sectional view of a main portion of the antenna device 101, and FIG. 3B is a cross-sectional view of the main portion of the antenna device 101.

The antenna device 101 includes a resin multilayer substrate 10 in which a plurality of resin sheets 11 to 16 are laminated to one another, and a coil conductor located on the resin multilayer substrate 10. The resin sheet 12 includes a plurality of linear portions 21 of the coil conductor on the lower surface thereof. The resin sheet 16 includes a plurality of linear portions 22 of the coil conductor located on the upper surface thereof. The resin sheets 12 to 16 include a plurality of via conductors (interlayer connection conductors) 23 and 24 of the coil conductor. These via conductors 23 connect a first end of the plurality of linear portions 21 and a first end of the plurality of linear portions 22. In addition, these via conductors 24 connect a second end of the plurality of linear portions 21 and a second end of the plurality of linear portions 22. The linear portions 21 and 22 and the via conductors 23 and 24 define a helical coil conductor along a laterally arranged flat square tube.

The resin sheets 13, 14, and 15 include an aperture AP in the center portion thereof. The lamination of these apertures AP defines a cavity CA. The cavity CA includes a magnetic substance core 40 that is embedded therein. This magnetic substance core 40 preferably is a sintered rectangular or substantially rectangular parallelepiped shaped magnetic ferrite, for example.

The resin sheet 11 includes terminal electrodes 31 and 32 on the lower surface thereof. One end of each of the plurality of linear portions 21 of the coil conductor is a via conductor and is connected to the terminal electrode 31. In addition, one end of each of the plurality of linear portions 22 of the coil conductor is a via conductor and is connected to the terminal electrode 32. Thus, the antenna device 101 can be used as a coil antenna with a magnetic substance core by connecting the terminal electrodes 31 and 32 to a communication circuit (a feeding circuit).

A non-limiting example of a method of manufacturing the antenna device 101 is as follows.

An etching resist is applied to a one sided copper foil clad resin sheet, an etching resist film is patterned and etched in order to form a land in a position in which a via conductor is formed, and then the etching resist film is removed.

A hole for via formation is formed from a surface opposed to a surface in which the land is formed by laser processing, and a conductive paste is applied to the hole by a squeegee and dried.

An aperture AP that receives a magnetic substance core therein is formed in resin sheets 13, 14, and 15 by punching.

A magnetic substance core 40 is arranged in a predetermined position of the resin sheet 16 in which no aperture is formed so that the magnetic substance core may enter the aperture at the time of lamination thereafter, and temporarily compression bonded with the resin sheet by lightly pressing so that the magnetic substance core may not be detached.

A plurality of resin sheets are laminated such that the resin sheets 15 to 11 are laminated in this order on the resin sheet 16, and then thermocompression bonded simultaneously. Alternatively, the resin sheets may be laminated such that one layer at a time is thermocompression bonded. Furthermore, the resin sheets may be attached by interposing an adhesive sheet.

It is to be noted that the manufacturing method described above is merely a non-limiting example and the present invention is not limited to this manufacturing method.

For example, in order to remove impurities after opening a hole for via formation, a plasma treatment may be performed in some cases, and a gold plating treatment and the like may be applied to a conductor in other cases.

The resin sheet may use, for example, thermoplastic resin having plasticity, such as polyimide and a liquid crystal polymer. In addition, a coil conductor, wiring, and an interlayer connection body can be formed of a metal material that is mainly composed of silver and copper and has a smaller resistivity, for example. In particular, the coil conductor and the wiring formed on a substrate may preferably be a metal foil, for example.

Figure 4:
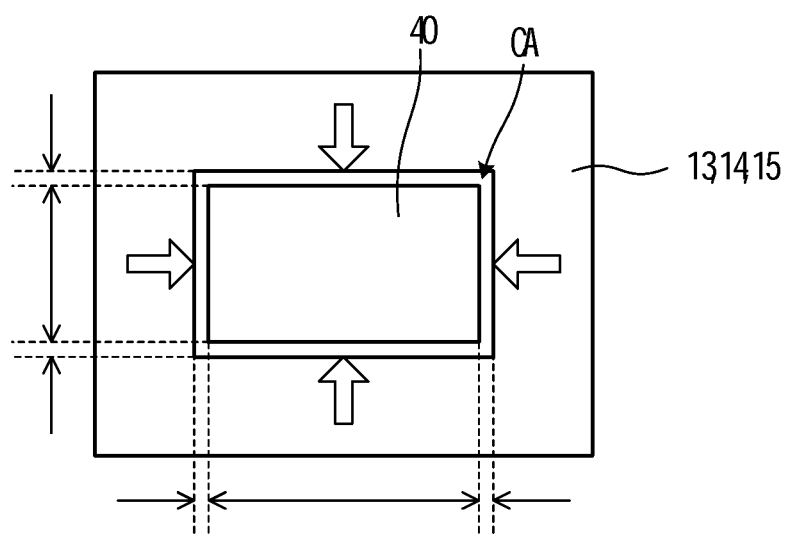
FIG. 4 is a view showing a size relationship on a plane between a resin sheet and a magnetic substance core 40 in a layer of resin sheets 13, 14, and 15 in which an aperture is formed.

FIG. 4 is a view showing a size relationship on a plane between a resin sheet and a magnetic substance core 40 in a layer of resin sheets 13, 14, and 15 on which an aperture AP (see FIG. 1) is formed. The lamination of the apertures of the resin sheets 13, 14, and 15 forms a cavity CA and the inner diameter dimension of this cavity CA is slightly larger than the outer dimension of the magnetic substance core 40. This avoids or diminishes a situation in which the resin sheets that are deformed when the resin sheets are laminated and thermocompression bonded with each other pressurize the magnetic substance core 40. Therefore, there is little or no load applied to the magnetic substance core 40, which can prevent or significantly reduce breakage of the magnetic substance core 40 due to thermal stress or a shock. However, after the thermocompression bonding, a gap may not necessarily be provided between the cavity CA and the magnetic substance core 40. It should be noted that the inner diameter dimension of the cavity that is slightly larger than the outer dimension of the magnetic substance core 40 also has an effect that the magnetic substance core 40 is easily inserted into the cavity at the time of an assembly (at the time of lamination of resin sheets).

Figure 5A:
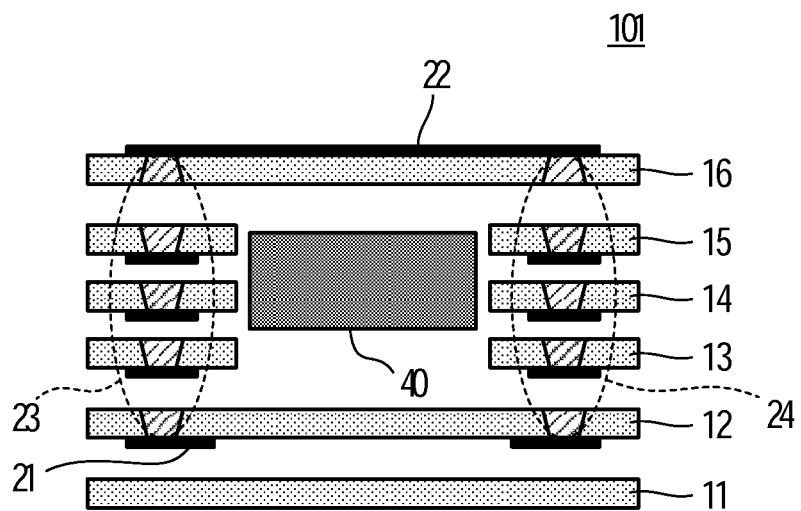
FIG. 5A is an exploded cross-sectional view of the antenna device 101 and FIG. 5B is a view showing an outer shape of the antenna device after thermocompression bonding.
Figure 5B:
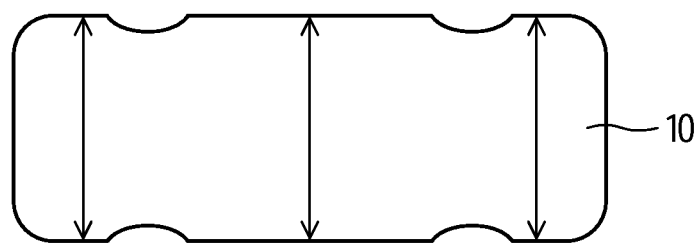
Figure 6A:
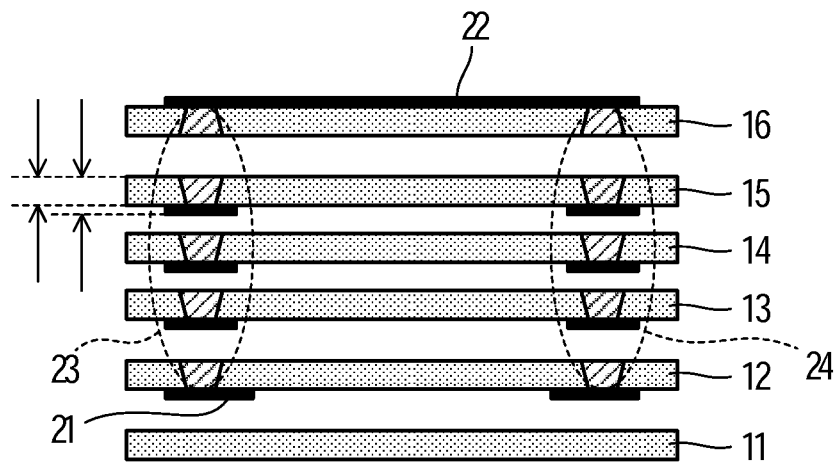
FIG. 6A is an exploded cross-sectional view of an antenna device as a comparative example of the antenna device 101 and FIG. 6B is a view showing an outer shape of the antenna device after thermocompression bonding.
Figure 6B:
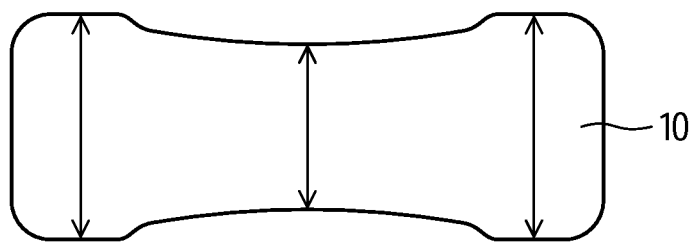

FIG. 5A is an exploded cross-sectional view of the antenna device 101 and FIG. 5B is a view showing an outer shape of the antenna device after thermocompression bonding. FIG. 6A is an exploded cross-sectional view of an antenna device as a comparative example of the antenna device 101, and FIG. 6B is a view showing an outer shape of the antenna device after thermocompression bonding. The antenna device according to this comparative example has no embedded magnetic substance core 40. As shown in FIG. 6B, while the resin multilayer substrate is not contracted in a thickness direction in a position of the via conductors 23 and 24 of the coil conductor, the resin multilayer substrate is contracted relatively greatly in a position other than the position in which the via conductor 23 and 24 are formed. The contraction tendency becomes remarkable, especially in a case in which the layered number of resin sheets is large or in a case in which the resin layer is thin. In this manner, when the thickness of the resin multilayer substrate differs locally, it becomes difficult to surface-mount the antenna device onto a mounting substrate. It also becomes difficult to mount a chip component on the upper surface of the resin multilayer substrate.

In contrast, the antenna device 101 according to a preferred embodiment of the present invention, as shown in FIG. 5B, the magnetic substance core 40 is embedded in the position other than the position in which the via conductors 23 and 24 of the coil conductor are formed, so that the contraction percentage of the resin multilayer substrate is small. That is to say, at the time of thermocompression bonding, the resin sheet flows or deforms so as to fill the gap between the cavity and the magnetic substance core 40, but does not deform further. Therefore, the overall thickness dimension of the resin multilayer substrate becomes comparatively uniform.

In this manner, a difference in thickness after lamination can be made difficult to be generated by setting the thickness of the magnetic substance core 40 to a thickness same as the thickness of the resin sheets or a thickness set in consideration of the thickness of the conductor. In addition, heat deformation of the resin layer is small since the arrangement of the magnetic substance core 40 mitigates the heat applied to the resin layer at a time of pressing.

The examples above indicate the antenna device according to a preferred embodiment of the present invention enables the magnetic substance alone to be fired since a coil conductor is not directly formed on the surface of the magnetic substance. As a result, a magnetic substance material having a high permeability and a low magnetic loss characteristic can be used as a magnetic substance core for a coil antenna. Moreover, since a coil conductor does not require co-firing, it is not necessary to use a material that can be fired at a high temperature but has a low conductivity, such as silver palladium and tungsten. Furthermore, a conductor formed by a method such as etching can be formed with a high dimensional accuracy and can obtain a stable electrical characteristic.

Second Preferred Embodiment

In a second preferred embodiment, a description is given of some configuration examples of a layered structure including a resin sheet and a magnetic substance core.

Figure 7A:
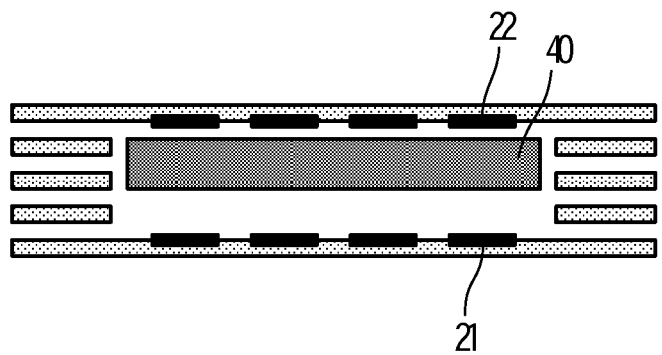
FIG. 7A is an exploded cross-sectional view of a main portion of an antenna device according to a second preferred embodiment of the present invention and FIG. 7B is a cross-sectional view showing a laminated state of the main portion.
Figure 7B:
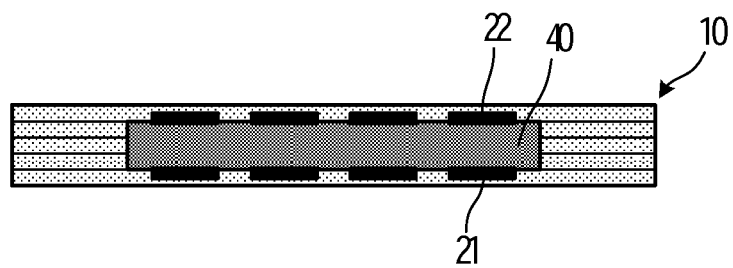

FIG. 7A is an exploded cross-sectional view showing a main portion of an antenna device according to the second preferred embodiment of the present invention, and FIG. 7B is a cross-sectional view.

In this example, the position in which the linear portions 21 and 22 of a coil conductor are located is such that the linear portions 21 and 22 of the coil conductor contact the magnetic substance core 40. According to this structure, the inductance obtained per overall line length of the coil conductor is large, so that conductor loss can be reduced and the Q value can be increased.

Figure 8A:
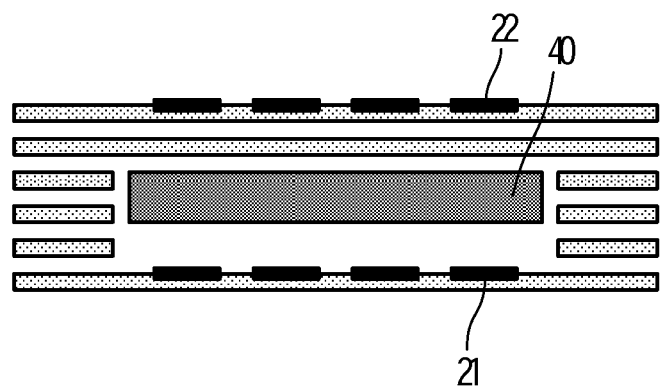
FIG. 8A is an exploded cross-sectional view of a main portion of an antenna device according to the second preferred embodiment of the present invention and FIG. 8B is a cross-sectional view showing a laminated state of the main portion.
Figure 8B:
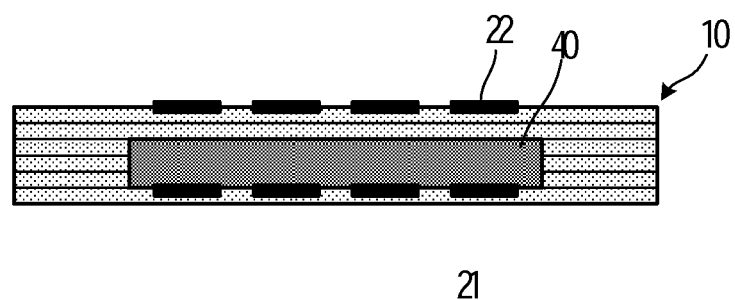

FIG. 8A is an exploded cross-sectional view showing a main portion of an antenna device according to the second preferred embodiment of the present invention, and FIG. 8B is a cross-sectional view. In this example, the gap between the linear portions 21 and 22 of the coil conductor and the magnetic substance core 40 is unbalanced above and below. According to this structure, the magnetic flux from the magnetic substance core 40 spreads differently above and below the magnetic substance core 40, which increases design flexibility. For example, in a case in which a metal body is positioned near the upper surface, the position of the magnetic substance core 40 with respect to the linear portions 21 and 22 of the coil conductor is defined so that the magnetic substance core 40 may be spaced away or offset from the metal body.

Figure 9A:
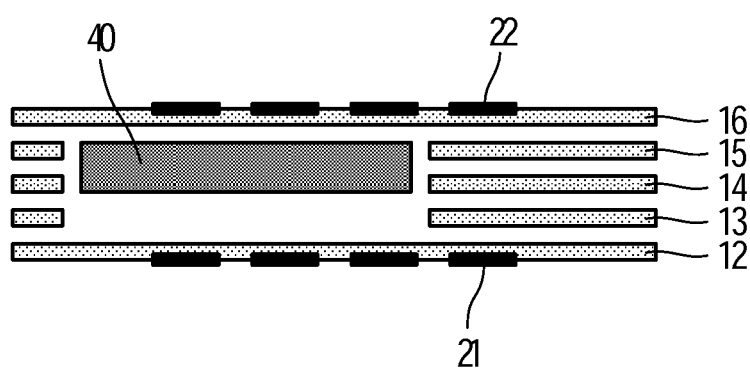
FIG. 9A is an exploded cross-sectional view of a main portion of an antenna device according to the second preferred embodiment of the present invention and FIG. 9B is a cross-sectional view showing a laminated state of the main portion.
Figure 9B:
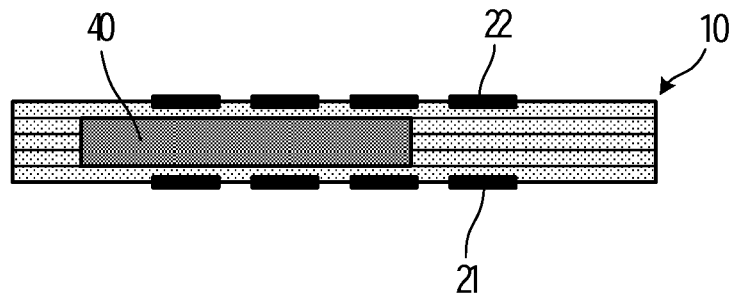

FIG. 9A is an exploded cross-sectional view showing a main portion of an antenna device according to the second preferred embodiment of the present invention, and FIG. 9B is a cross-sectional view showing a laminated state of the main portion. In this example, the linear portions 21 and 22 of the coil conductor and the magnetic substance core 40 are unbalanced in the right and left directions.

According to this structure, the magnetic flux from the magnetic substance core 40 spreads differently in the right and left sides of the magnetic substance core 40, which increases design flexibility.

For example, the position of the magnetic substance core 40 with respect to the linear portions 21 and 22 of the coil conductor can be defined so that the magnetic flux may bypass, if possible, a nearby metal body. In addition, the magnetic flux spreads in the offset direction of the magnetic substance core 40, which can also control the directivity of an antenna. More particularly, since the magnetic substance core 40 can be located in a position close to the end of the mounting substrate and thus a magnetic field spreads to the lower side (a surface opposed to a surface on which the antenna device is mounted) of the mounting substrate, so that the antenna can have increased directivity to cover a wide angle. It is to be noted that in the examples as shown in FIG. 9A and FIG. 9B, the magnetic substance core 40 projects leftward from a range in which the linear portions 21 and 22 of the coil conductor are located, but does not necessarily need to project. For example, the length of the magnetic substance core 40 is preferably shorter than the range in which the linear portions 21 and 22 of the coil conductor are located, and the magnetic substance core 40 may be offset (arranged in a displaced state) to the right or left in the range in which the linear portions 21 and 22 of the coil conductor are located. Also with this structure, the magnetic flux from the magnetic substance core 40 spreads differently in the right and left sides of the magnetic substance core 40 and spreads in the offset direction of the magnetic substance core 40. Thus, the directivity of the antenna can be controlled.

Figure 10A:
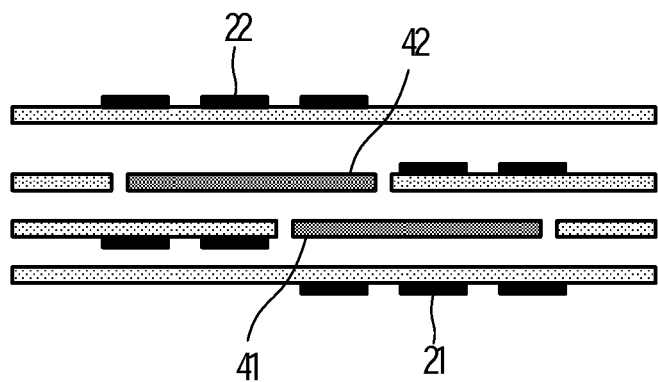
FIG. 10A is an exploded cross-sectional view of a main portion of an antenna device according to the second preferred embodiment of the present invention and FIG. 10B is a cross-sectional view showing a laminated state of the main portion.
Figure 10B:
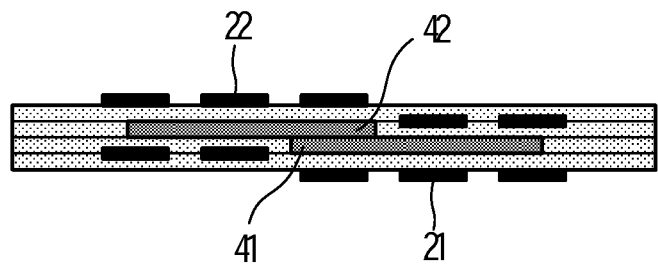

FIG. 10A is an exploded cross-sectional view of a main portion of an antenna device according to the second preferred embodiment of the present invention and FIG. 10B is a cross-sectional view showing the laminated state of the main portion. In this example, the resin multilayer substrate includes two magnetic substance cores 41 and 42, which are arranged in mutually displaced positions in the planar direction. According to this configuration, the layers in which the linear portions 21 and 22 of the coil conductor are provided are also partially displaced.

According to this structure, since the magnetic substance core and the coil winding shaft are substantially oriented in a direction oblique with respect to the surface of the multilayer substrate, the directivity corresponding to the direction is obtained.

Figure 11A:
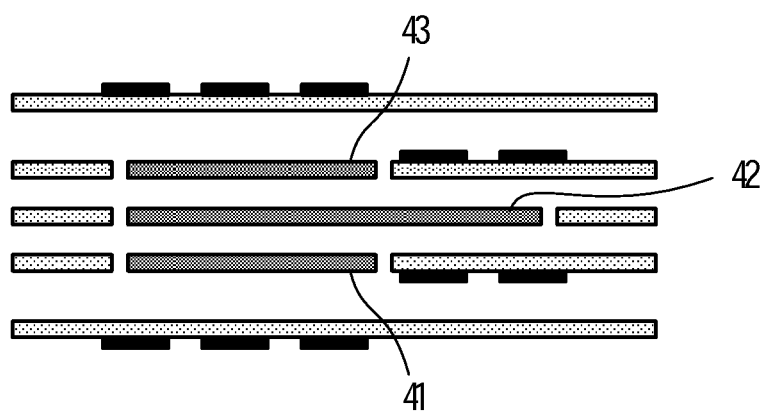
FIG. 11A is an exploded cross-sectional view of a main portion of an antenna device according to the second preferred embodiment of the present invention and FIG. 11B is a cross-sectional view showing a laminated state of the main portion.
Figure 11B:
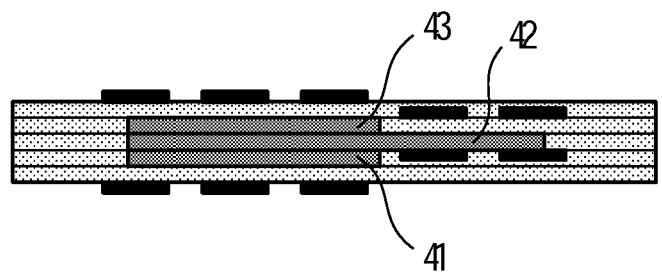

FIG. 11A is an exploded cross-sectional view showing a main portion of an antenna device according to the second preferred embodiment of the present invention and FIG. 11B is a cross-sectional view showing a laminated state of the main portion. In this example, three magnetic substance cores 41, 42, and 43 are provided and arranged in mutually displaced positions in the planar direction. According to this structure, the magnetic field focuses on a portion in which the magnetic substance core is relatively thick, which controls the directivity.

In a case in which a plurality of magnetic substance cores are laminated as shown in FIG. 10B and FIG. 11B, each of the magnetic substance cores does not need to be joined mutually; and as a result of being laminated together with a resin sheet, the plurality of magnetic substance cores are arranged in lamination.

Figure 12A:
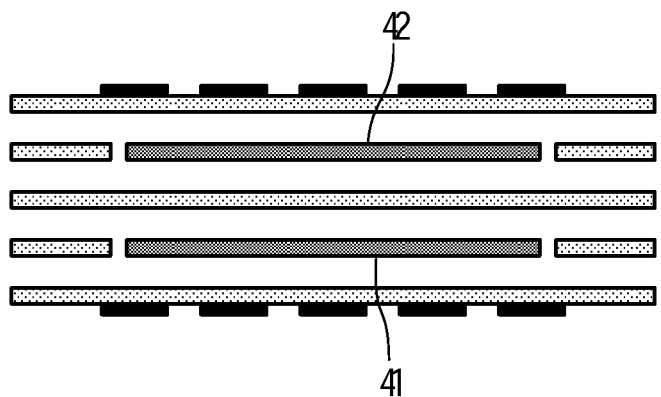
FIG. 12A is an exploded cross-sectional view of a main portion of an antenna device according to the second preferred embodiment of the present invention and FIG. 12B is a cross-sectional view showing a laminated state of the main portion.
Figure 12B:
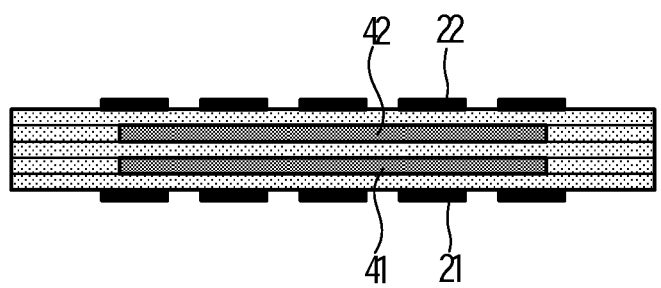

FIG. 12A is an exploded cross-sectional view showing a main portion of an antenna device according to the second preferred embodiment of the present invention and FIG. 12B is a cross-sectional view showing a laminated state of the main portion. In this example, two magnetic substance cores 41 and 42 are provided and the two magnetic substance cores 41 and 42 are separated from each other in the thickness direction. According to this structure, even when the sum total volume of the two magnetic substance cores 41 and 42 is small, the magnetic substance can be closer to the linear portions 21 and 22 of the coil conductor.

Therefore, the necessary quantity of the expensive ferrite material is significantly reduced, which can lead to cost reduction. In addition, since each of the magnetic substance cores can be thinner, the firing of ferrite becomes easy and the production of a magnetic substance core also becomes easy.

It should be noted that the magnetic substance may be replaced with a plurality of magnetic substance cores including a material with different permeability and the like and may not necessarily be formed into a rectangular or substantially rectangular shape.

Third Preferred Embodiment

Figure 13:
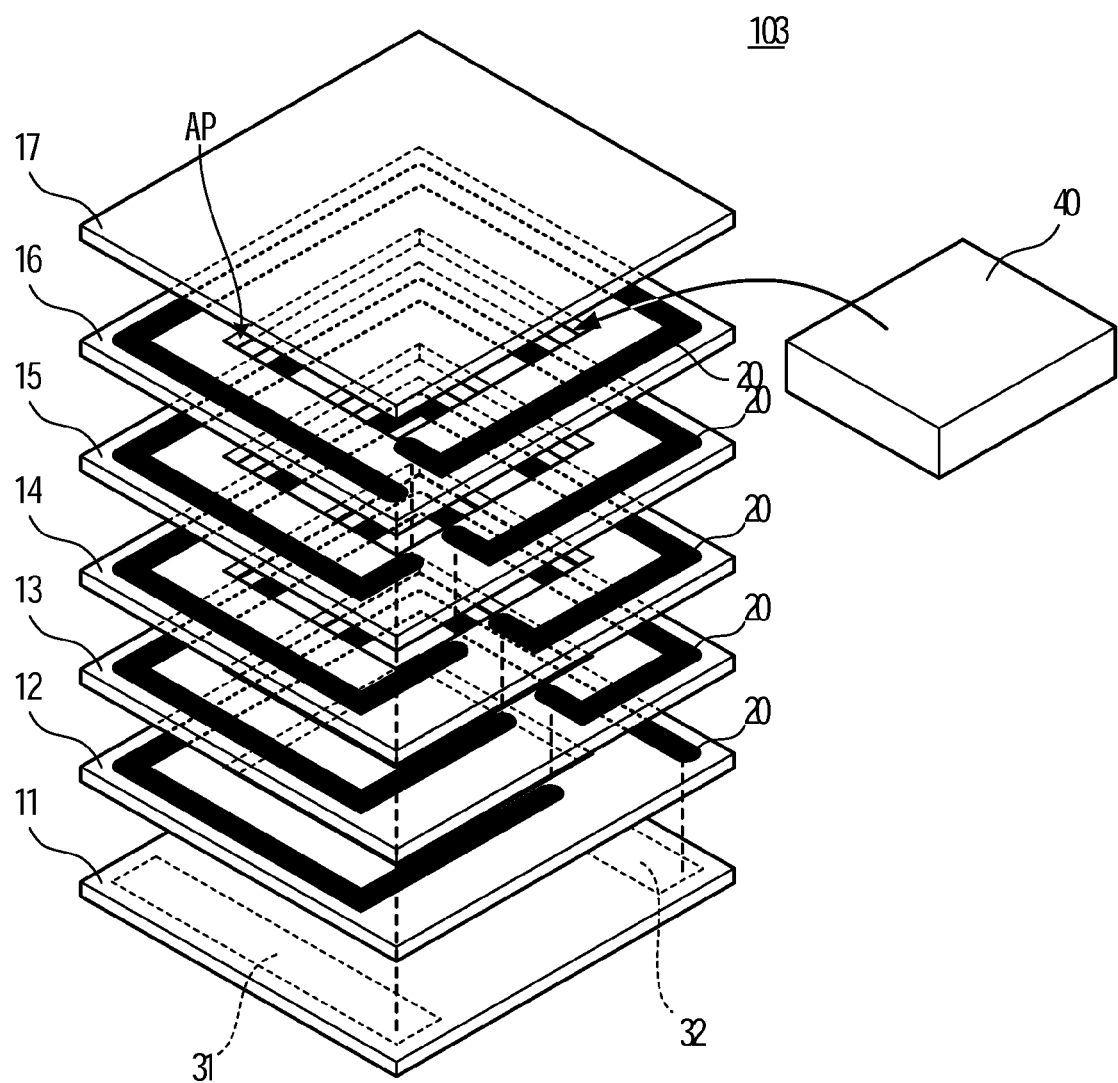
FIG. 13 is an exploded perspective view of an antenna device 103 according to a third preferred embodiment of the present invention.
Figure 14:
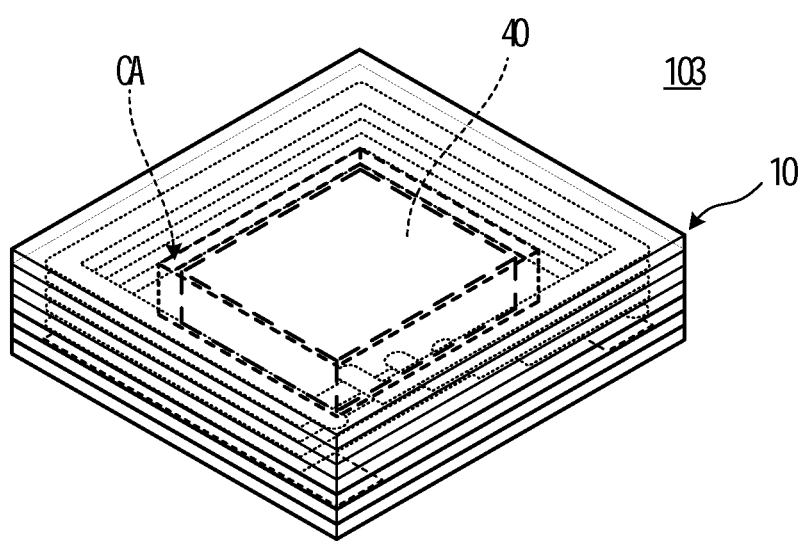
FIG. 14 is a perspective view of the antenna device 103.

FIG. 13 is an exploded perspective view of an antenna device 103 according to a third preferred embodiment of the present invention while FIG. 14 is a perspective view of the antenna device 103.

The antenna device 103 includes a resin multilayer substrate 10 in which a plurality of resin sheets 11 to 17 are laminated to one another, and a coil conductor located on the resin multilayer substrate 10. The resin sheets 12 to 16 each include an aperture AP formed therein and define a cavity CA by laminating the apertures. The cavity CA includes a magnetic substance core 40 that is embedded therein. The resin sheets 12 to 16 also include a coil conductor 20 that is arranged so as to extend around on the surface of the resin sheets 12 to 16, and respective coil conductors 20 of the resin sheets are connected to each other through a via conductor formed in the resin sheets 13 to 16. In addition, one end of the coil conductor 20 located in the resin sheet 16 is connected to the terminal electrode 31 through the via conductor formed in the resin sheets 11 to 16, the other end of the coil conductor 20 formed in the resin sheet 12 is connected to the terminal electrode 32 through the via conductor formed in the resin sheets 11 and 12.

In this way, the coil winding shaft of the coil conductor may be oriented in the laminating direction of the resin multilayer substrate 10.

Fourth Preferred Embodiment

Figure 15:
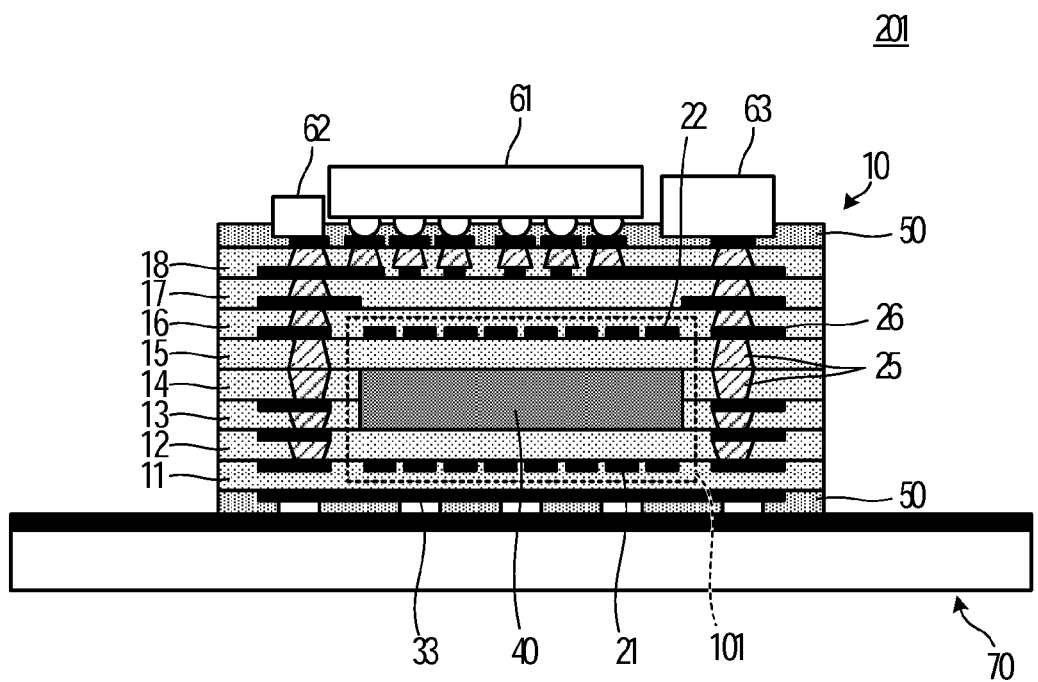
FIG. 15 is a cross-sectional view of a main portion of an antenna integrated RF module 201 according to a fourth preferred embodiment of the present invention.

FIG. 15 is a cross-sectional view of a main portion of an antenna integrated RF module 201 according to a fourth preferred embodiment of the present invention. The lamination of a plurality of resin sheets 11 to 18 defines a resin multilayer substrate 10. The resin multilayer substrate 10 includes a magnetic substance core 40 that is embedded therein. The resin multilayer substrate 10 also includes a coil conductor defined by linear portions 21 and 22 and the like so as to be wound around a periphery of the magnetic substance core 40.

The resin multilayer substrate 10 further includes wiring and a circuit defined by a via conductor 25 and an electrode 26. The upper surface of the resin multilayer substrate 10 is provided with an electrode and a solder resist 50 on which mounted components 61, 62, and 63 are mounted. The lower surface (surface on which the antenna device is mounted) of the resin multilayer substrate 10 is provided with a terminal electrode 33 and a solder resist 50.

The mounted components 61, 62, and 63 preferably are an RFIC, a chip capacitor, a chip inductor, and the like. An antenna integrated RF module 201 preferably is used as a short-range wireless communication module, such as NFC. This antenna integrated RF module 201 is mounted on a mounting substrate 70 on which the antenna device is provided, so that a wireless communication device that has a short-range wireless communication function can be configured.

Figure 16:
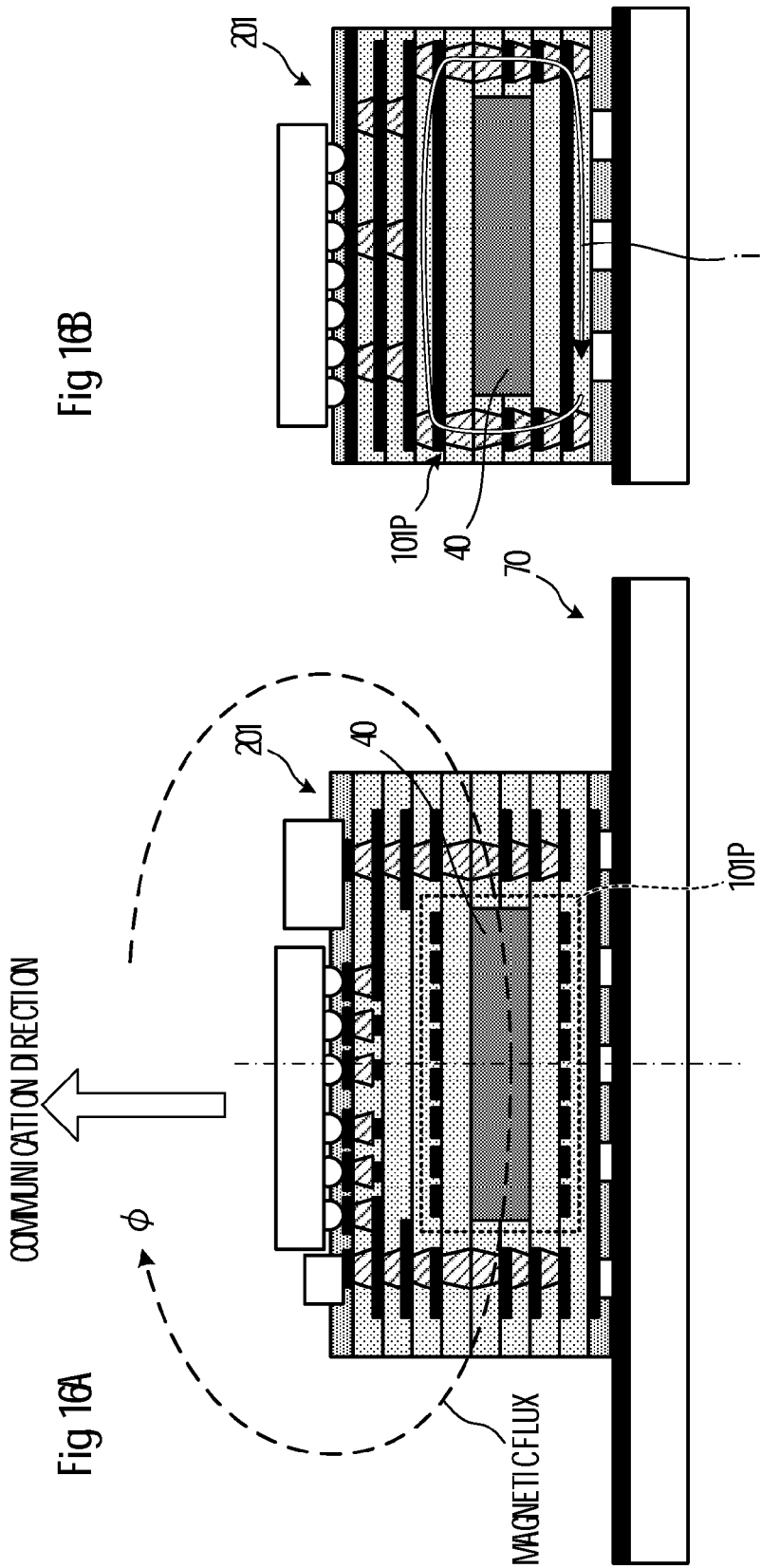
FIG. 16A is a view schematically showing a state of a magnetic flux loop by an antenna portion 101P of the antenna integrated RF module 201 and FIG. 16B is a cross-sectional view taken in a plane (as indicated by a dashed-dotted line in FIG. 16A) perpendicular to a coil winding shaft of the antenna portion 101P of the antenna integrated RF module 201.

FIG. 16A is a view schematically showing a state of a magnetic flux loop by an antenna portion 101P of the antenna integrated RF module 201 and FIG. 16B is a cross-sectional view taken in a plane (as indicated by a dashed-dotted line in FIG. 16A) perpendicular to a coil winding shaft of the antenna portion 101P of the antenna integrated RF module 201. When a current i flows in a coil conductor of the antenna portion 101P, the antenna portion 101P generates magnetic flux φ, which interlinks with a coil of an antenna of a communication counterpart. In this way, an area above (in a direction perpendicular or substantially perpendicular to the mounting substrate 70) the antenna integrated RF module 201 can be defined as a communication direction.

Fifth Preferred Embodiment

Figure 17:
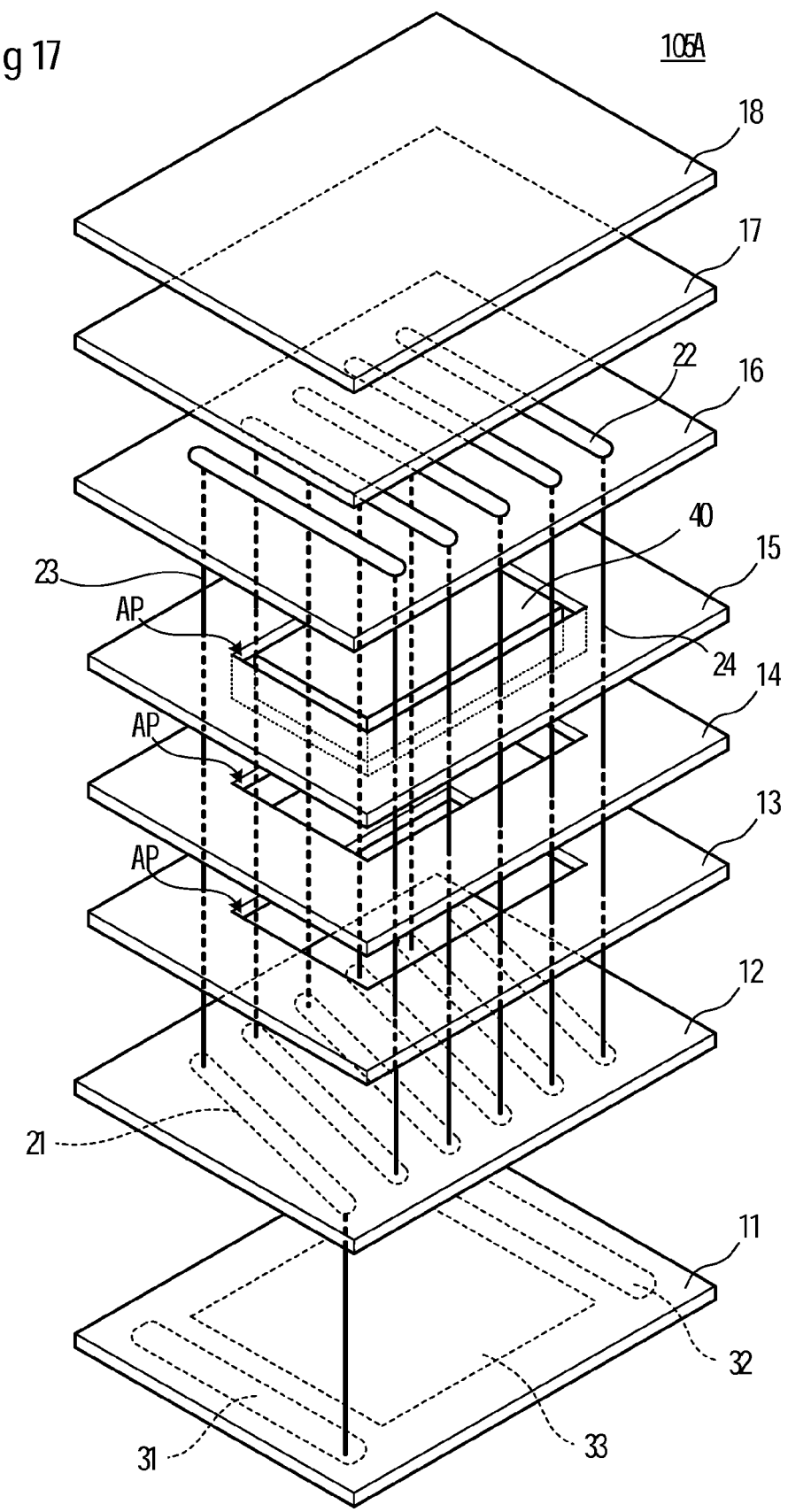
FIG. 17 is an exploded perspective view of an antenna device 105A according to a fifth preferred embodiment of the present invention.

FIG. 17 is an exploded perspective view of an antenna device 105A according to a fifth preferred embodiment of the present invention.

Unlike the antenna device 101 as shown in FIG. 1 in the first preferred embodiment of the present invention, the lower surface (the surface on which the antenna device 105A is mounted) of the resin sheet 11 is provided with not only the terminal electrodes 31 and 32 but also the terminal electrode 33.

The magnetic substance core 40 preferably has a flat plate shape and the terminal electrode 33 extends two-dimensionally so as to cover the lower surface of the magnetic substance core 40. This terminal electrode 33 corresponds to the "first conductor pattern" of a preferred embodiment of the present invention. The terminal electrode 33 is an NC terminal (electrically unconnected idle terminal) that mounts the antenna device 105A.

The magnetic substance core 40 preferably is a low temperature fired ferrite of an Ni—Zn system, and the relative dielectric constant of the magnetic substance core 40 preferably is 15, for example. The resin sheets 12 to 16 on which the coil conductor is located, among the plurality of resin sheets, have relative dielectric constants of 80 to 100. The resin sheet 11 between the terminal electrode 33 and the linear portions 21 of the coil conductor has a relative dielectric constant of 3.

As described above, the relative dielectric constant of the resin sheet 11 between the first conductor pattern and the coil conductor is lower than the relative dielectric constant of the resin sheets 12 to 16 on which the coil conductor is provided. Therefore, it is possible to prevent or significantly reduce unnecessary stray capacitance of the linear portions of the coil conductor, the unnecessary stray capacitance being generated through the first conductor pattern 33. The relative dielectric constant of the resin sheet 11 between the terminal electrode 33 and the linear portions 21 of the coil conductor may preferably be 3.5 or less, for example.

Figure 18:
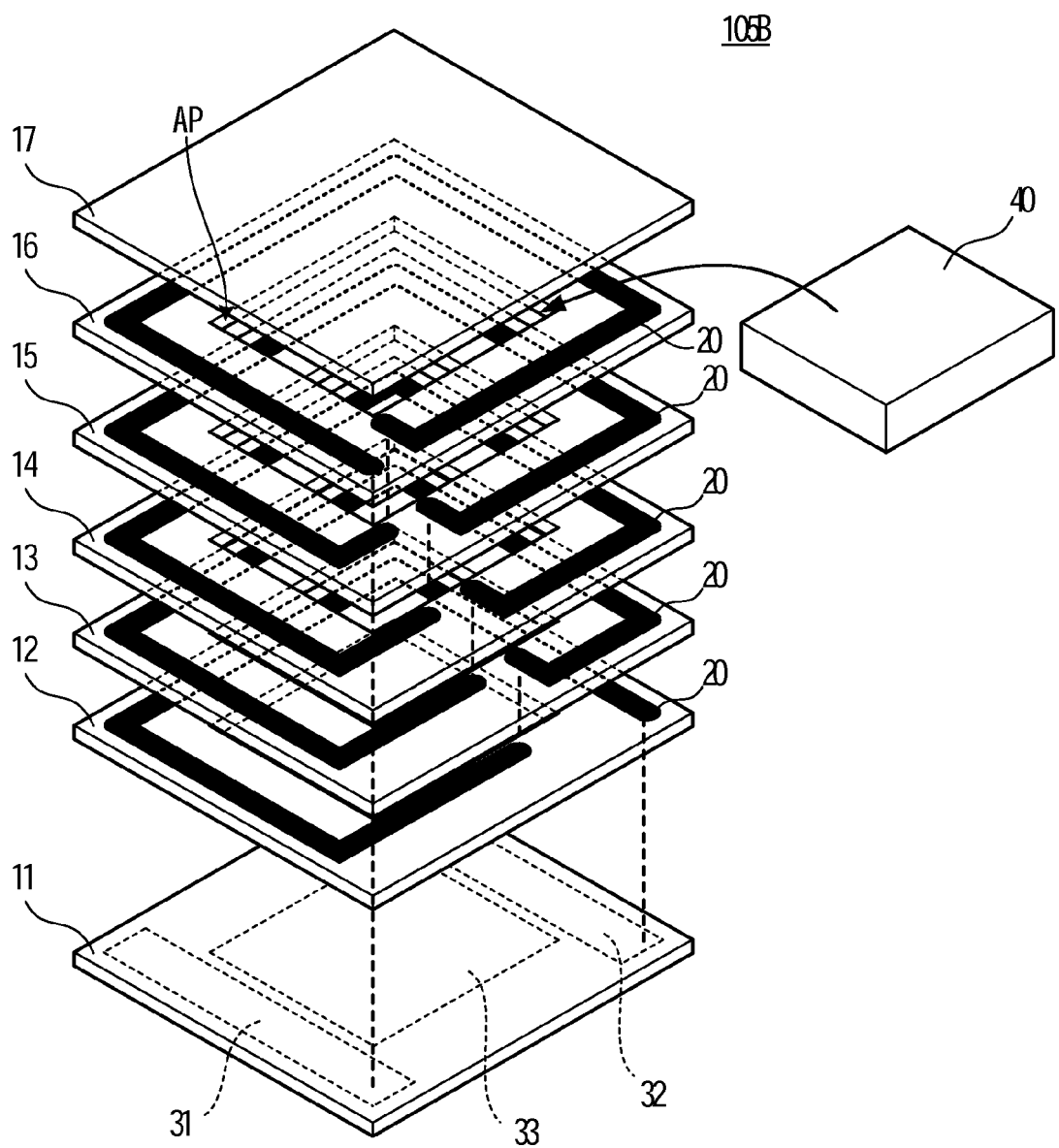
FIG. 18 is an exploded perspective view of another antenna device 105B according to the fifth preferred embodiment of the present invention.
Figure 19:
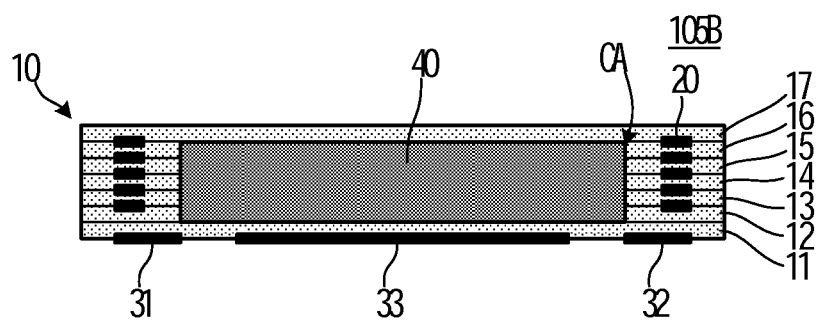
FIG. 19 is a cross-sectional view of the antenna device 105B.

FIG. 18 is an exploded perspective view of another antenna device 105B according to the fifth preferred embodiment of the present invention while FIG. 19 is a cross-sectional view of the antenna device 105B.

The antenna device 105B includes a resin multilayer substrate 10 in which a plurality of resin sheets 11 to 17 are laminated to one another and a coil conductor located on the resin multilayer substrate 10. The resin sheets 12 to 16 each include an aperture AP formed therein and define a cavity CA by laminating the apertures. The cavity CA includes a magnetic substance core 40 that is embedded therein. The resin sheets 12 to 16 also include a coil conductor 20 that is arranged so as to extend around on the surface of the resin sheets 12 to 16, and respective coil conductors 20 of the resin sheets 12 to 16 are connected to each other through a via conductor formed in the resin sheets 13 to 16. In addition, one end of the coil conductor 20 formed in the resin sheet 16 is connected to the terminal electrode 31 through the via conductor formed in the resin sheets 11 to 16, and the other end of the coil conductor 20 formed in the resin sheet 12 is connected to the terminal electrode 32 through the via conductor formed in the resin sheets 11 and 12. Unlike the antenna device 103 as shown in FIG. 13, the lower surface (surface on which the antenna device 105B is mounted) of the resin sheet 11 is provided with not only the terminal electrodes 31 and 32 but also a terminal electrode 33.

In this way, the coil winding shaft of the coil conductor may be oriented in the laminating direction of the resin multilayer substrate.

Figure 20A:
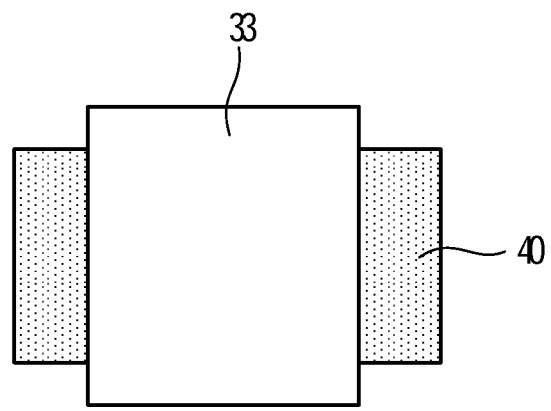
FIG. 20A and FIG. 20B are plan views showing another positional relationship between a magnetic substance core 40 and a terminal electrode 33 of the antenna device according to the fifth preferred embodiment of the present invention.
Figure 20B:
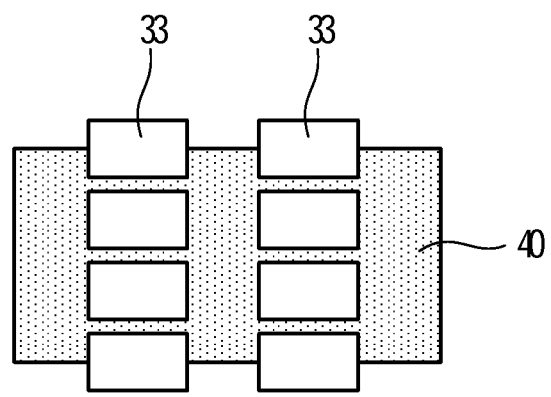

FIG. 20A and FIG. 20B are plan views showing another positional relationship between a magnetic substance core 40 and a terminal electrode 33 according to the fifth preferred embodiment of the present invention. As shown in FIG. 20A, the terminal electrode 33 (the first conductor pattern) need not cover the whole magnetic substance core 40 and may be arranged so as to cover at least a portion of the magnetic substance core 40. In addition, as shown in FIG. 20B, the number of the terminal electrodes 33 (the first conductor pattern) may be plural.

It should be noted that the first conductor pattern may be arranged in a position so as to cover both sides of the magnetic substance core 40 fully or partially.

Sixth Preferred Embodiment

Figure 21:
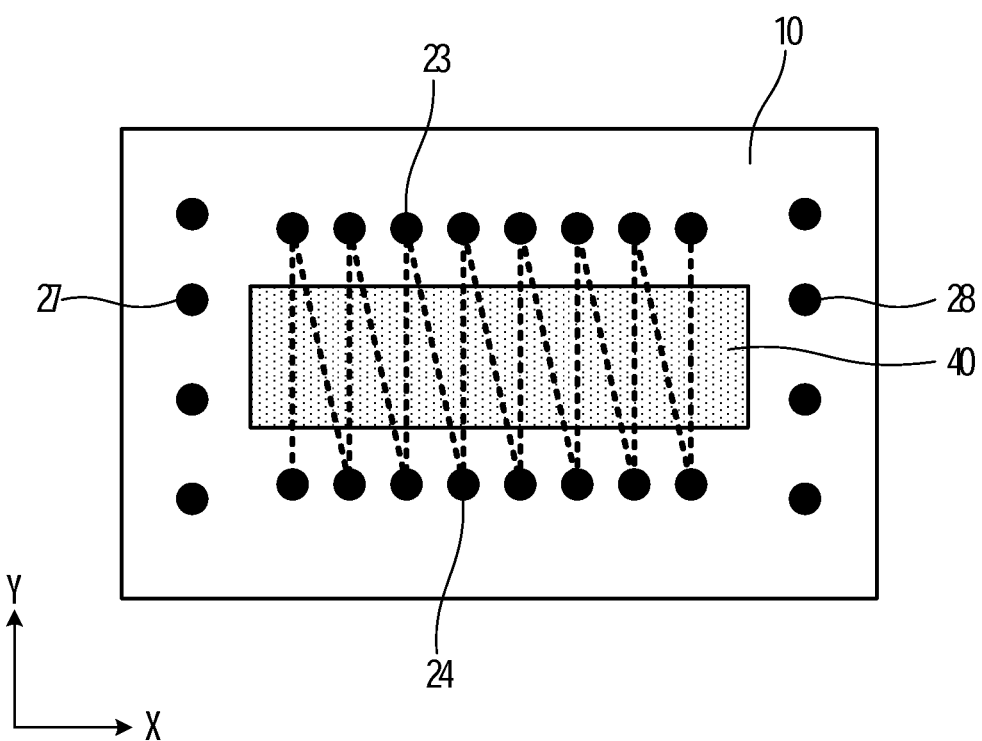
FIG. 21 is a view showing an antenna integrated RF module according to a sixth preferred embodiment, and is a plan view of a resin sheet in which an aperture is formed.

FIG. 21 is a view showing an antenna integrated RF module according to a sixth preferred embodiment of the present invention, and is a plan view of a resin sheet in which an aperture is located. In this preferred embodiment of the present invention, the magnetic substance core 40 is also shown. The basic structure of the whole antenna integrated RF module is preferably the same as that shown in FIG. 15. Via conductors 23 and 24 are included as part of coil conductors and are arranged along the long side of the magnetic substance core 40 (in the X axis direction). Via conductors 27 and 28 are via conductors other than a conductor that defines a coil and are arranged (arrayed in the Y axis direction) near the short side of the magnetic substance core 40.

In this way, the via conductors are arranged around the magnetic substance core 40 in a plan view. Accordingly, the via conductors 23, 24, 27, and 28 prevent or significantly reduce the resin fluidity at a time of compression bonding the plurality of resin sheets, which prevents the magnetic substance core 40 from being displaced in the planar direction in the resin multilayer substrate. It should be noted that the via conductors 27 and 28 may be dummy conductors that do not define a circuit and are not electrically connected to other conductors or electrical components.

Seventh Preferred Embodiment

Figure 22A:
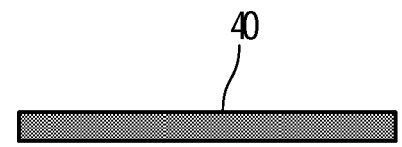
FIG. 22A, FIG. 22B, and FIG. 22C are views showing a structure of an antenna and a method of manufacturing the antenna device according to a seventh preferred embodiment of the present invention.
Figure 22B:
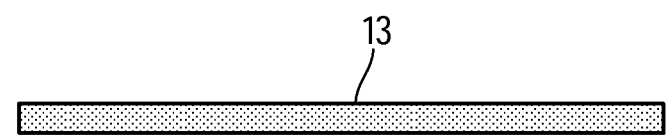
Figure 22C:
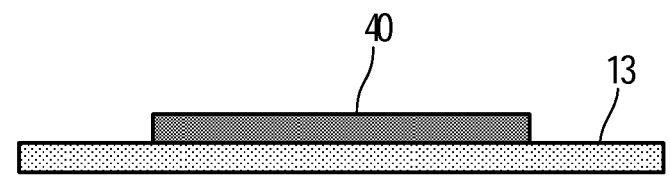

FIG. 22A, FIG. 22B, and FIG. 22C are views showing a structure of an antenna and a method of manufacturing the antenna device according to a seventh preferred embodiment of the present invention. FIG. 22A is a cross-sectional view showing a resin sheet 13 and a magnetic substance core 40 and FIG. 22B is a cross-sectional view showing a state in which the magnetic substance core 40 is temporarily compression bonded with the resin sheet 13. The resin sheet 13 does not include any linear portions of the coil conductor in a position, in a plan view, in which the resin sheet 13 and the magnetic substance core 40 overlap with each other.

FIG. 22C is a cross-sectional view showing a state in which a plurality of resin sheets are laminated, the resin sheets including the resin sheet 13 with which the magnetic substance core 40 is, as shown in FIG. 22B, temporarily compression bonded. After the state as shown in FIG. 22C, this laminated body is permanently compression bonded (press molded), which defines a resin multilayer substrate.

The linear portions 21 of the coil conductor are not located on any one of the surfaces of the resin sheet 13, but are located on the resin sheet 12. Therefore, as shown in FIG. 22B, the linear portions 21 of the coil conductor do not exist at the time of temporarily compression bonding. Thus, when the magnetic substance core 40 is temporarily compression bonded with the resin sheet 13, the magnetic substance core 40 can be prevented from breaking with the linear portions 21 as a starting point of bending.

Eighth Preferred Embodiment

Figure 24A:
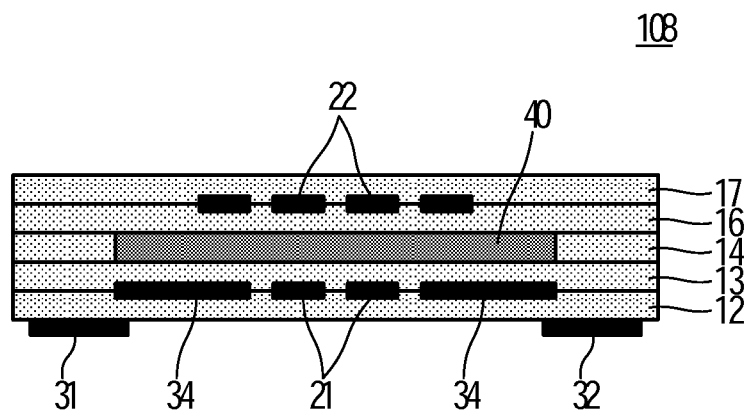
FIG. 24A is a cross-sectional view of the antenna device 108 and FIG. 24B is a plan view of a resin sheet 12.
Figure 24B:
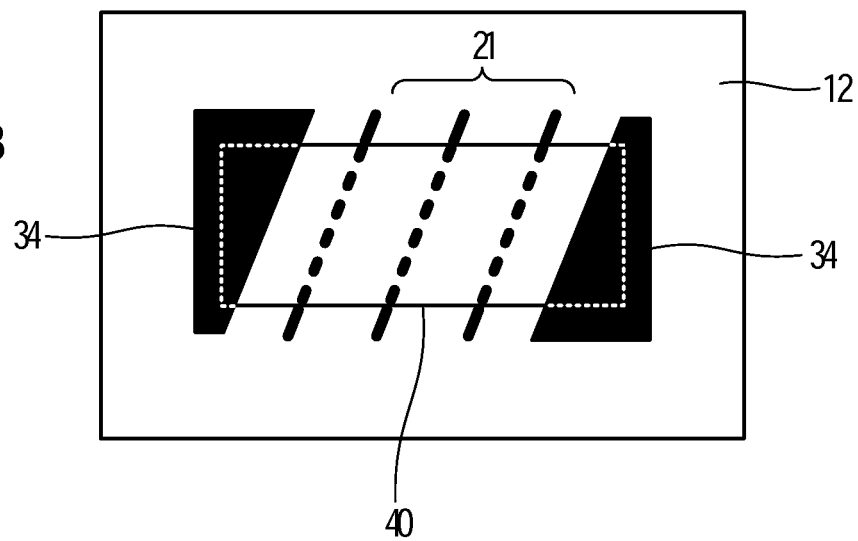

FIG. 23 is an exploded perspective view of an antenna device 108 according to an eighth preferred embodiment of the present invention. FIG. 24A is a cross-sectional view of the antenna device 108 and FIG. 24B is a plan view of a resin sheet 12. However, FIG. 24A and FIG. 24B show the linear portions 21, 22 of which the number shown in FIG. 23 is reduced. The antenna device 108 includes a resin multilayer substrate in which a plurality of resin sheets 12, 13, 14, 16, and 17 are laminated to one another, and a coil conductor located on the resin multilayer substrate. The resin sheet 12 includes a plurality of linear portions 21 of the coil conductor and a second conductor pattern 34 that are located on the upper surface thereof. The resin sheet 12 includes terminal electrodes 31 and 32 that are located on the lower surface thereof. The resin sheet 16 includes a plurality of linear portions 22 of the coil conductor that are located on the upper surface thereof. The resin sheets 13, 14, and 16 include a plurality of via conductors (interlayer connection conductors) of the coil conductor that are located thereon. These linear portions 21 and 22 and the via conductors define a helical coil conductor along a laterally arranged flat square tube.

The resin sheet 14 includes an aperture AP in the center portion thereof. The lamination of the apertures AP defines a cavity in which a magnetic substance core 40 is embedded.

As shown in FIG. 24B, the second conductor pattern 34 is arranged in a position in which the second conductor pattern 34 overlaps a short side of the magnetic substance 40. The magnetic substance core 40 includes a short side that has relatively large displacement, which effectively prevents or significantly reduces the displacement of the short side of the magnetic substance core 40 and prevents or significantly reduces stress to the magnetic substance core 40. In addition, the resin sheet 12 and the whole of the resin multilayer substrate are reinforced. These structural arrangements prevent the breakage of the magnetic substance core 40 at a time of compression bonding (at a time of press molding) the plurality of resin sheets.

Figure 25A:
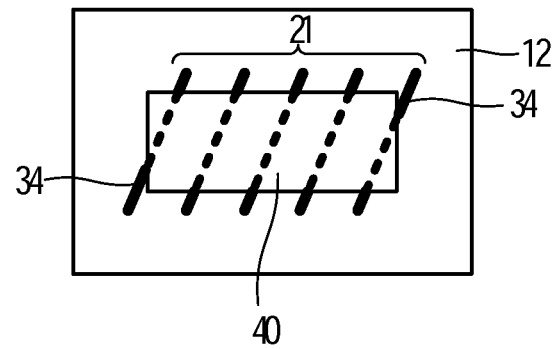
FIG. 25A, FIG. 25B, and FIG. 25C are views showing other shape examples of a second conductor pattern.
Figure 25B:
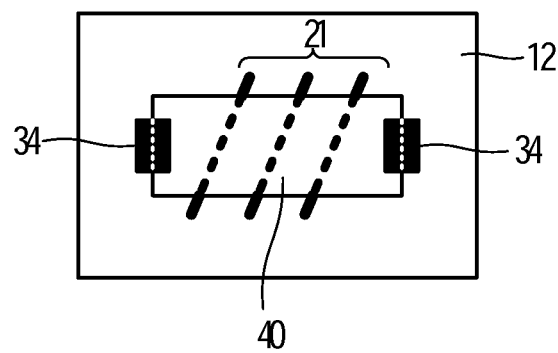
Figure 25C:
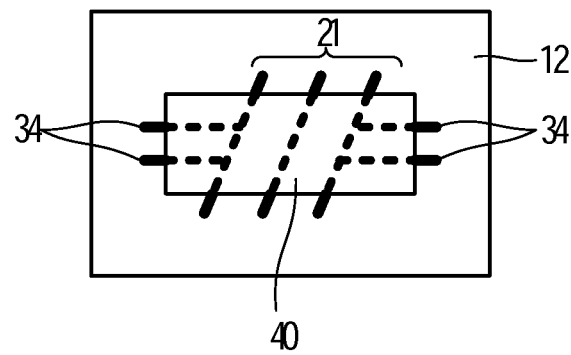

FIG. 25A, FIG. 25B, and FIG. 25C are views showing other shape examples of a second conductor pattern according to a preferred embodiment of the present invention. The second conductor pattern 34 arranged in a position in which the second conductor pattern 34 overlaps the short side of the magnetic substance core 40, as shown in FIG. 25A, may overlap a portion of the linear portions 21 of the coil conductor. The second conductor pattern 34, as shown in FIG. 25B, may not need to overlap the whole of the short side of the magnetic substance core 40. In addition, the second conductor pattern 34, as shown in FIG. 25C, may be extended to a direction different from a direction to which the linear portions 21 of the coil conductor extend. It is to be noted that in order to prevent the second conductor pattern 34 from generating a stepped portion, as shown in all of FIG. 23, FIGS. 24A and 24B, and FIGS. 25A, 25B, and 25C, the second conductor pattern 34 may preferably further include a conductor portion such as the linear portions 21 of the coil conductor in a position held between two of the second conductor patterns 34.

Ninth Preferred Embodiment

Figure 26A:
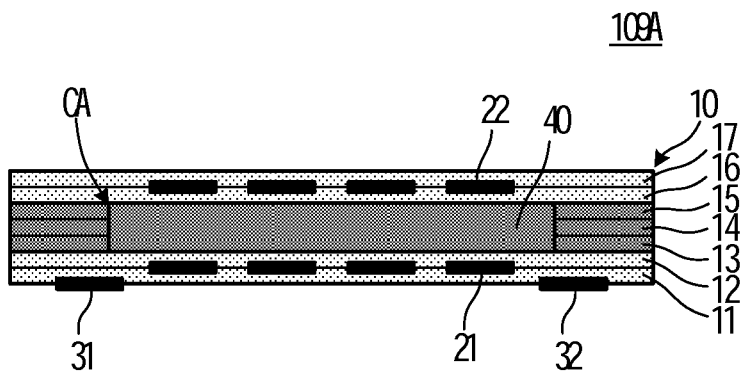
FIG. 26A, FIG. 26B, and FIG. 26C are cross-sectional views of three antenna devices 109A, 109B, and 109C according to a ninth preferred embodiment of the present invention.
Figure 26B:
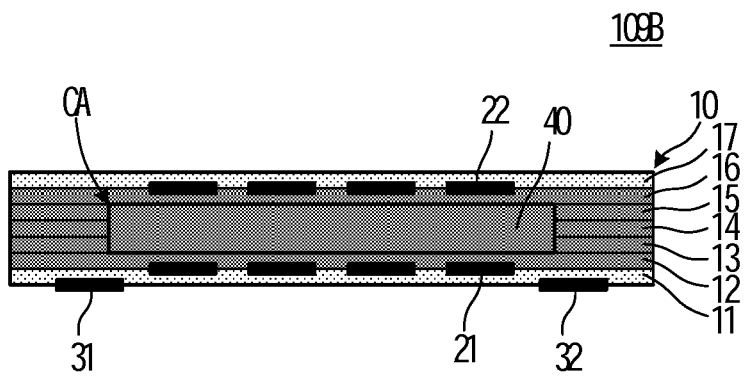
Figure 26C:
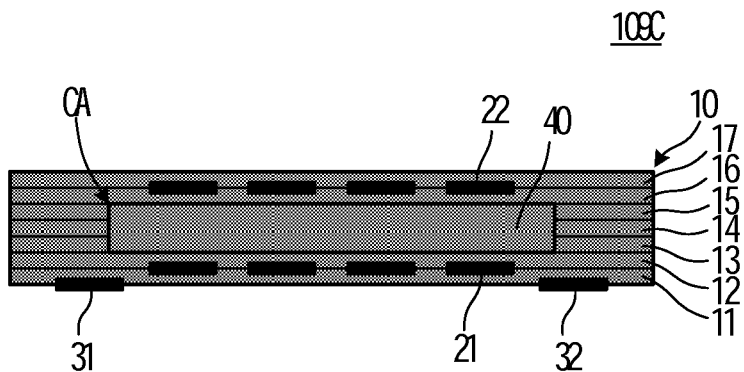

FIG. 26A, FIG. 26B, and FIG. 26C are cross-sectional views showing three antenna devices 109A, 109B, and 109C according to a ninth preferred embodiment of the present invention. The basic structure of these antenna devices 109A, 109B, and 109C preferably is the same as that shown in FIG. 3. In this preferred embodiment, the linear portions 22 of the coil conductor include a resin sheet 17 laminated on the top. In FIG. 26A, the resin sheets 13, 14, and 15 which have an aperture that defines a cavity are magnetic bodies. Thus, the resin sheets 13, 14, and 15 together with the magnetic substance core 40 act as a magnetic core of an antenna coil. In addition, in FIG. 26B, the resin sheets 12 to 16 held between the linear portions 21 and 22 of the coil conductor are sheets including a magnetic substance. Thus, the resin sheets 12 to 16 together with the magnetic substance core 40 act as a magnetic core of an antenna coil. Furthermore, in FIG. 26C, all the resin sheets 11 to 17 are sheets including a magnetic substance. Thus, the resin sheets 11 to 17 together with the magnetic substance core 40 act as a magnetic core of an antenna coil. A sheet including a magnetic substance can be obtained, for example, by softening and fluidizing a resin sheet and a resin pellet, then mixing the softened and fluidized resin sheet and resin pellet with magnetic filler, and forming the mixture into a sheet.

These configurations prevent or significantly reduce a change in characteristics since the overall shape of the magnetic substance is not substantially changed even if the magnetic substance core 40 in the resin multilayer substrate is displaced in the planar direction.

Tenth Preferred Embodiment

Figure 27A:
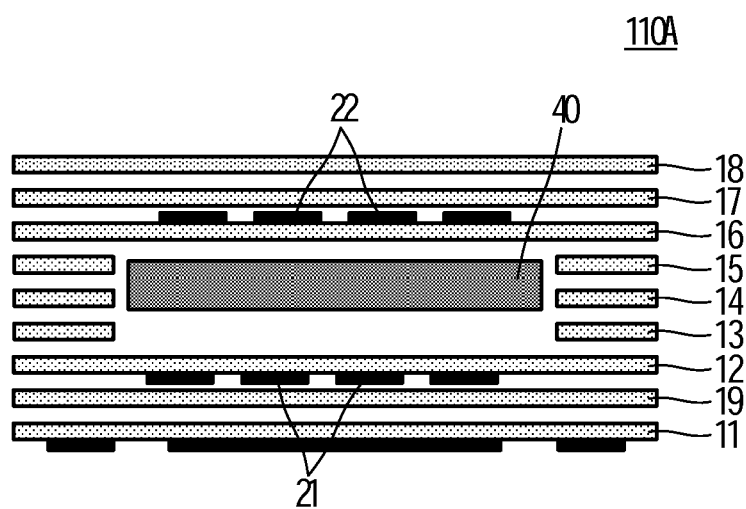
FIG. 27A is a cross-sectional view before lamination compression bonding of an antenna device 110A according to a tenth preferred embodiment of the present invention and FIG. 27B is a cross-sectional view of the antenna device 110A.
Figure 27B:
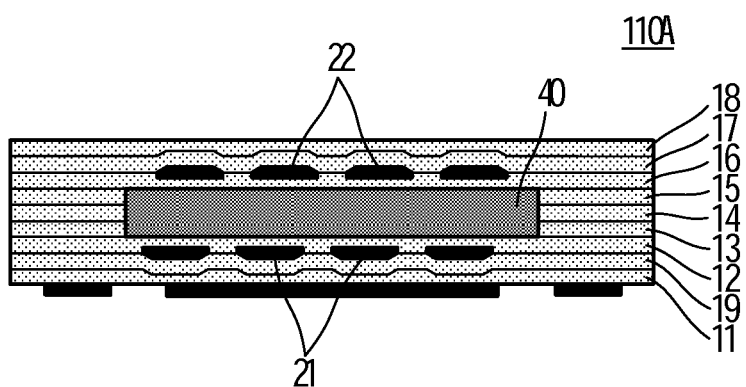

FIG. 27A is a cross-sectional view before lamination compression bonding of an antenna device 110A according to a tenth preferred embodiment of the present invention and FIG. 27B is a cross-sectional view of the antenna device 110A according to the tenth preferred embodiment of the present invention. The basic structure is preferably the same as that shown in FIG. 3. The antenna device 110A differs from the antenna device 101 shown in FIG. 3 in that the antenna device 110A includes resin sheets 17, 18, and 19. Additionally, as shown in FIG. 27B, due to compression bonding of the resin sheets, the resin sheets are deformed in a corrugated plate shape along the sectional shape of the linear portions 21 and 22 of the coil conductor adjacent in a laminating direction. The resin sheets 11 to 18 are thermoplastic resin sheets, and are deformed as shown in FIG. 23B by being heated and pressurized. Accordingly, the resin sheet and the resin multilayer substrate have high rigidity in a direction in which a corrugated plate shaped peak or trough continues. Therefore, at the time of compression bonding (at the time of press molding) the resin sheets, the resin magnetic substance core 40 can be made more resistant to breakage.

In the above preferred embodiments of the present invention, while the state of deformation of the resin sheets due to compression bonding is not illustrated, in practice, as shown in the tenth preferred embodiment, the resin sheets are deformed in a corrugated plate shape. Figures according to the tenth preferred embodiment of the present invention illustrate deformation of the resin sheet due to compression bonding.

Figure 28A:
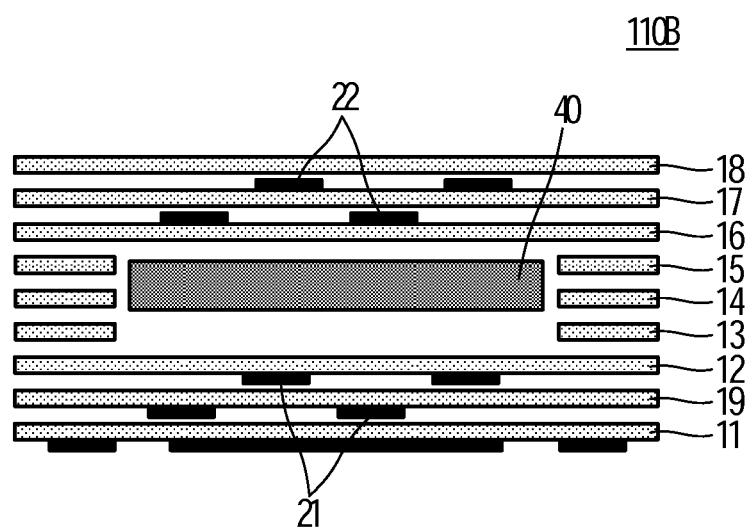
FIG. 28A is a cross-sectional view before lamination compression bonding of another antenna device 110B according to the tenth preferred embodiment of the present invention and FIG. 28B is a cross-sectional view of the antenna device 110B.
Figure 28B:
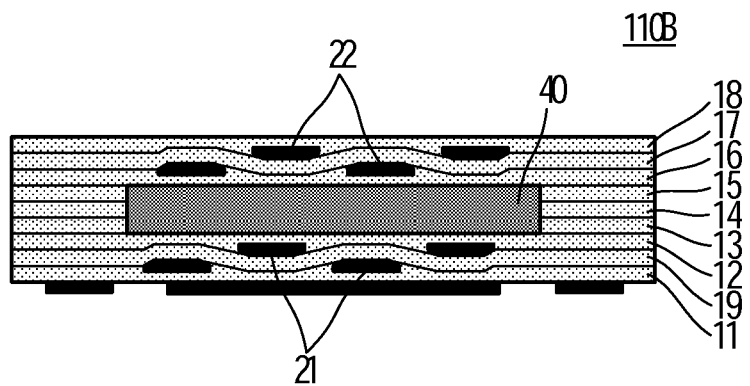

FIG. 28A is a cross-sectional view before lamination compression bonding of another antenna device 110B according to the tenth preferred embodiment of the present invention and FIG. 28B is a cross-sectional view of the antenna device 110B. In this example, the linear portions 21 of the coil conductor are alternately and separately provided in the two layers of the resin sheets 12 and 19. Similarly, the linear portions 22 of the coil conductor are alternately and separately provided in two layers of the resin sheets 16 and 17. In such a structure, as shown in FIG. 28B, the resin sheets 17 and 19 deeply undulate in the corrugated plate shape. Accordingly, the resin sheet 17 and 19 and the resin multilayer substrate have higher rigidity in a direction in which a corrugated plate shaped peak or trough continues.

Figure 29A:
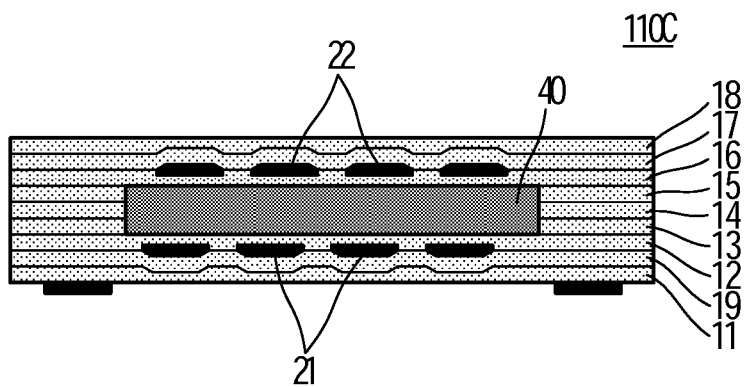
FIG. 29A is a cross-sectional view of another antenna device 110C according to the tenth preferred embodiment of the present invention.
Figure 29B:
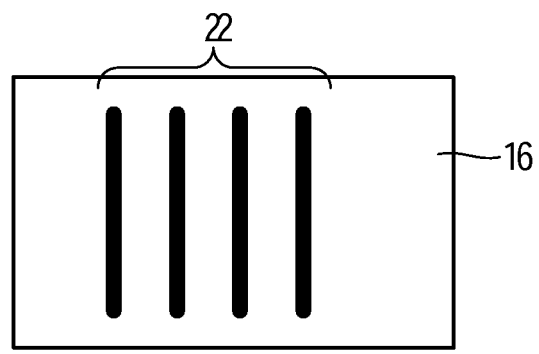
FIG. 29B is a plan view of a resin sheet 16.
Figure 29C:
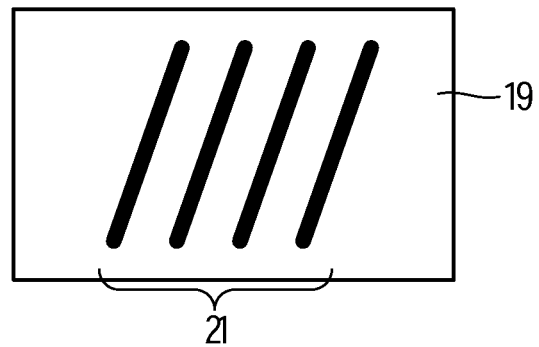
FIG. 29C is a plan view of a resin sheet 19.

FIG. 29A is a cross-sectional view of another antenna device 110C according to the tenth preferred embodiment of the present invention, FIG. 29B is a plan view of a resin sheet 16, and FIG. 29C is a plan view of a resin sheet 19. The linear portions 21 and 22 of the coil conductor extend in different directions, so that the above-stated rigidity of two shafts is increased. Thus, the rigidity of the plurality of resin sheets and the resin multilayer substrate in the planar direction is increased (no direction in which the resin sheets and the resin multilayer substrate tend to be bent), and the breakage of the magnetic substance core 40 can be more effectively avoided at a time of compression bonding (at a time of press molding) the resin sheets.

It should be noted that the whole of the plurality of resin sheets need not to be corrugated panel shaped, and the closer resin sheets are to the magnetic substance core, the more preferable the resin sheets are to be corrugated panel shaped. In addition, the corrugated panel shape may be made by not only the linear portions of the coil conductor but also other wiring patterns. Furthermore, a dummy linear conductor pattern that is perpendicular or substantially perpendicular to the linear portions of the coil conductor may be provided to make the above-described two shafts that improve rigidity intersect perpendicularly.

Eleventh Preferred Embodiment

FIG. 30 is a cross-sectional view of a main portion of an antenna device according to an eleventh preferred embodiment of the present invention. However, in this example, the antenna device is not a simple antenna device but an antenna device including an antenna integrated RF module 201 (that is, including an RF module). This antenna device includes the antenna integrated RF module 201 and a booster coil 301. The configuration of the antenna integrated RF module 201 is preferably the same as that as shown in the fourth preferred embodiment of the present invention, and the antenna integrated RF module 201 includes an antenna portion 101P that is used as a feeding coil to feed electric power to the booster coil 301.

Figure 31:
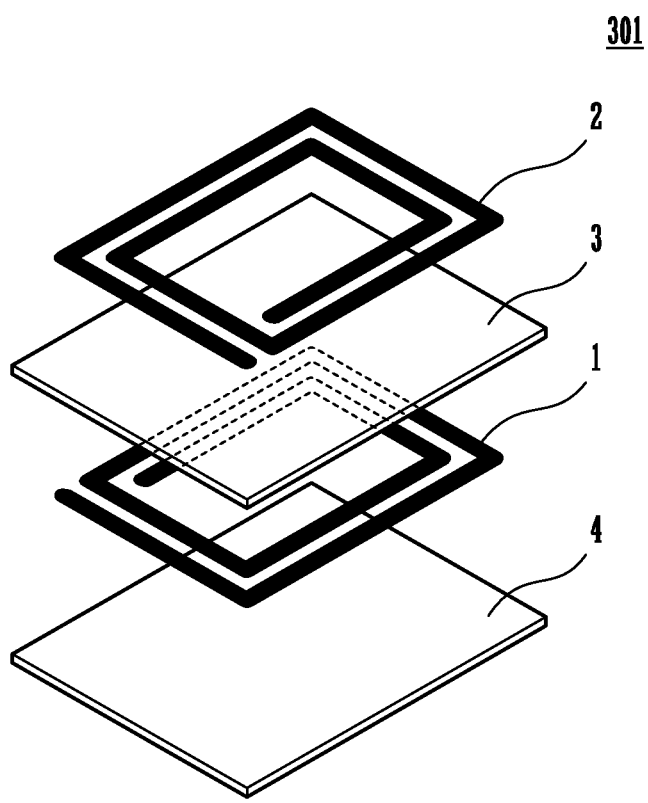
FIG. 31 is an exploded perspective view of a booster coil 301.

FIG. 31 is an exploded perspective view of the booster coil 301. The booster coil 301 includes an insulator base material 3, a first coil 1 located on a first surface of the insulator base material, a second coil 2 located on a second surface of the insulator base material, and a magnetic substance sheet 4. The first coil 1 and the second coil 2 are conductors patterned in a shape having a rectangular or substantially rectangular spiral shape, and also patterned to be capacitively coupled in a state in which a current flows in the same direction in a plan view. The two coil conductors are patterned so that, in a plan view from the same direction, when a clockwise current flows in one of the coil conductors, a clockwise current also may flow in the other coil conductor.

As shown with a magnetic flux $\phi$ in FIG. 30, the antenna portion 101P of the RF module 201 and the booster coil 301 are arranged so as to be magnetically coupled with each other. The magnetic substance sheet 4 is thin to such an extent not to block the magnetic coupling between the antenna portion 101P and the booster coil 301 of the RF module 201. In addition, the magnetic substance sheet 4 shields the magnetic field that is generated from the booster coil 301, and prevents an eddy current from occurring in a ground conductor located in the mounting substrate 70. It is to be noted that the magnetic substance sheet 4 need not necessarily be provided.

While the present preferred embodiment of the present invention preferably relates to an antenna device including the antenna integrated RF module 201 (that is, including an RF module), an antenna device may include no RF module. For example, the antenna device 101 and the booster coil 301 may be combined to configure an antenna device.

Figure 32:
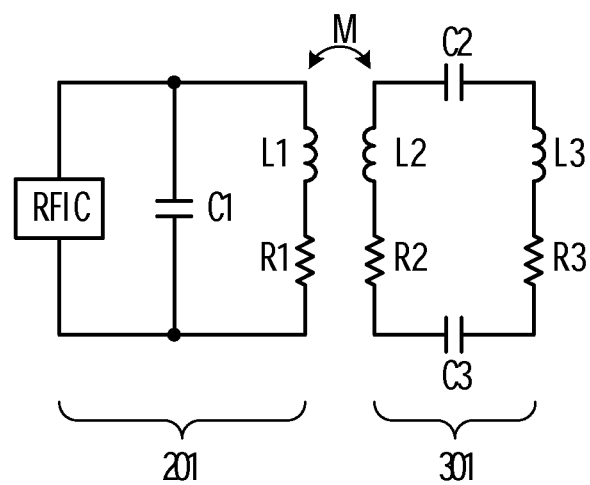
FIG. 32 is an equivalent circuit diagram of the antenna device as shown in FIG. 30.

FIG. 32 is an equivalent circuit diagram of the antenna device as shown in FIG. 30. The antenna integrated RF module 201 includes the coil conductor of the antenna portion 101P, an inductance component L1 by the magnetic substance core 40, a resistance component R1 of the antenna portion 101P, a capacitor C1, an RFIC, and the like. The capacitor C1 represents a capacitance that adjusts the resonant frequency of the antenna portion (the feeding coil) 101P. The booster coil 301 includes inductance components L2 and L3 of the first coil 1 and the second coil 2, capacitance components C2 and C3 generated between the first coil 1 and the second coil 2, and resistance components R2 and R3 of the first coil 1 and the second coil 2.

In this way, the antenna portion 101P located in the resin multilayer substrate 10 may be used as a feeding coil, and a booster coil 301 that is a different body from the resin multilayer substrate 10 may preferably be used as a booster antenna. This significantly extends the maximum communicable distance.

Twelfth Preferred Embodiment

Figure 33A:
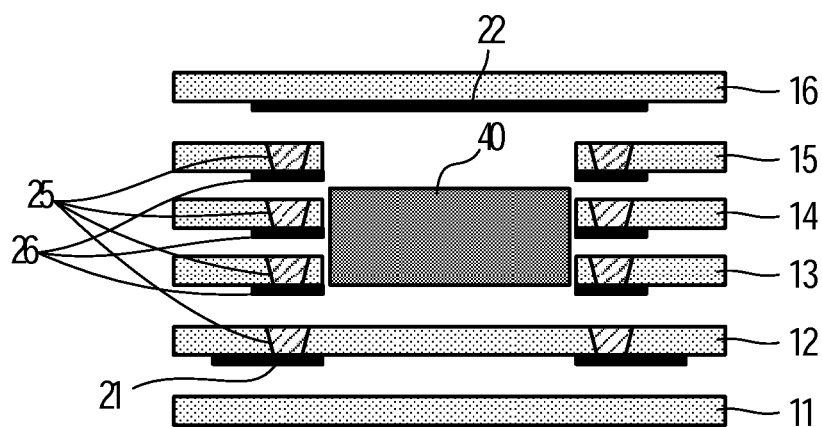
FIG. 33A is a cross-sectional view before lamination compression bonding of an antenna device 112 according to a twelfth preferred embodiment of the present invention and FIG. 33B is a cross-sectional view of the antenna device 112.
Figure 33B:
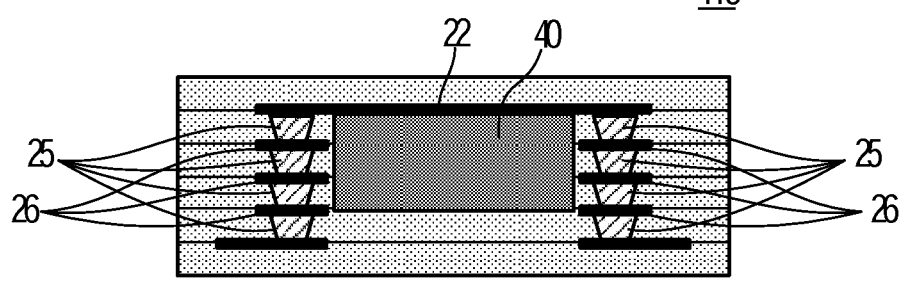

FIG. 33A is a cross-sectional view before lamination compression bonding of an antenna device 112 according to a twelfth preferred embodiment of the present invention and FIG. 33B is a cross-sectional view of the antenna device 112. The basic structure is preferably the same as the structure shown in FIG. 2 and FIG. 5A. However, in the twelfth preferred embodiment, the electrode 26 located in a position of the via conductor 25 is formed so as to be exposed to the inner surface of the cavity (space in which the magnetic substance core 40 is embedded.) In addition, the linear portions 22 of the coil conductor are located on the lower surface (the surface in contact with the magnetic substance core 40 by lamination) of the resin sheet 16.

Thus, the formation of the electrode 26 located in the position of the via conductor 25 so as to be exposed to the inner surface of the cavity reduces the amount of resin on the inner side (on the side of the cavity) of a layered conductor portion (a conductor extending in the laminating direction) defined by the via conductor 25 and the electrode 26, as compared to the preferred embodiment shown in FIG. 5A. Therefore, the following advantageous effects may be obtained.

(1) The amount of resin flow in a range in which the coil conductor is located when the resin sheets are thermocompression bonded is small and the displacement of the magnetic substance core 40 against the coil conductor is small. Therefore, a change in characteristics is prevented or significantly reduced.

(2) Without expanding the range in which the coil conductor is located, the size of the cavity can be increased, and thus a larger magnetic substance core 40 can be embedded. The coil conductor is arranged in a position close to the magnetic substance core 40. Accordingly, the permeability in a coil winding area increases. These effects also increase the inductance obtained per volume in the range in which the coil conductor is located. In other words, it is possible to reduce the volume in the range in which the coil conductor is located, the volume being required to obtain necessary inductance.

It should be noted the via conductor 25 may preferably be exposed on the side surface of the cavity. For the purpose, the via conductor 25 is first located on the resin sheet, and then an aperture for the cavity may be punched in a position in which the aperture overlaps the via conductor 25.

Thirteenth Preferred Embodiment

Figure 34:
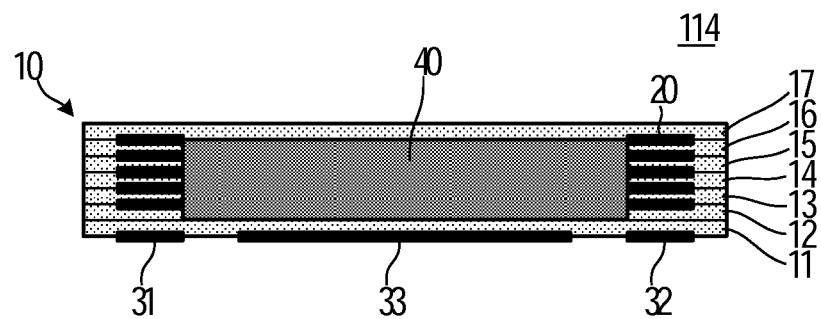
FIG. 34 is a cross-sectional view after thermocompression bonding of an antenna device 113 according to a thirteenth preferred embodiment of the present invention.

FIG. 34 is a cross-sectional view after thermocompression bonding of an antenna device 113 according to a thirteenth preferred embodiment of the present invention. The basic structure is preferably the same as the structure shown in FIG. 18 and FIG. 19. However, in the thirteenth preferred embodiment, the coil conductor 20 is formed so as to be exposed to the inner surface of the cavity (space in which the magnetic substance core 40 is embedded.)

Thus, the formation of the coil conductor 20 located so as to be exposed to the inner surface of the cavity significantly reduces the amount of resin on the inner side (on the side of the cavity) of the coil conductor 20, as compared to the preferred embodiment shown in FIG. 19. Therefore, the advantageous effects that are similar to those described in the twelfth preferred embodiment may be obtained.

Fourteenth Preferred Embodiment

Figure 35:
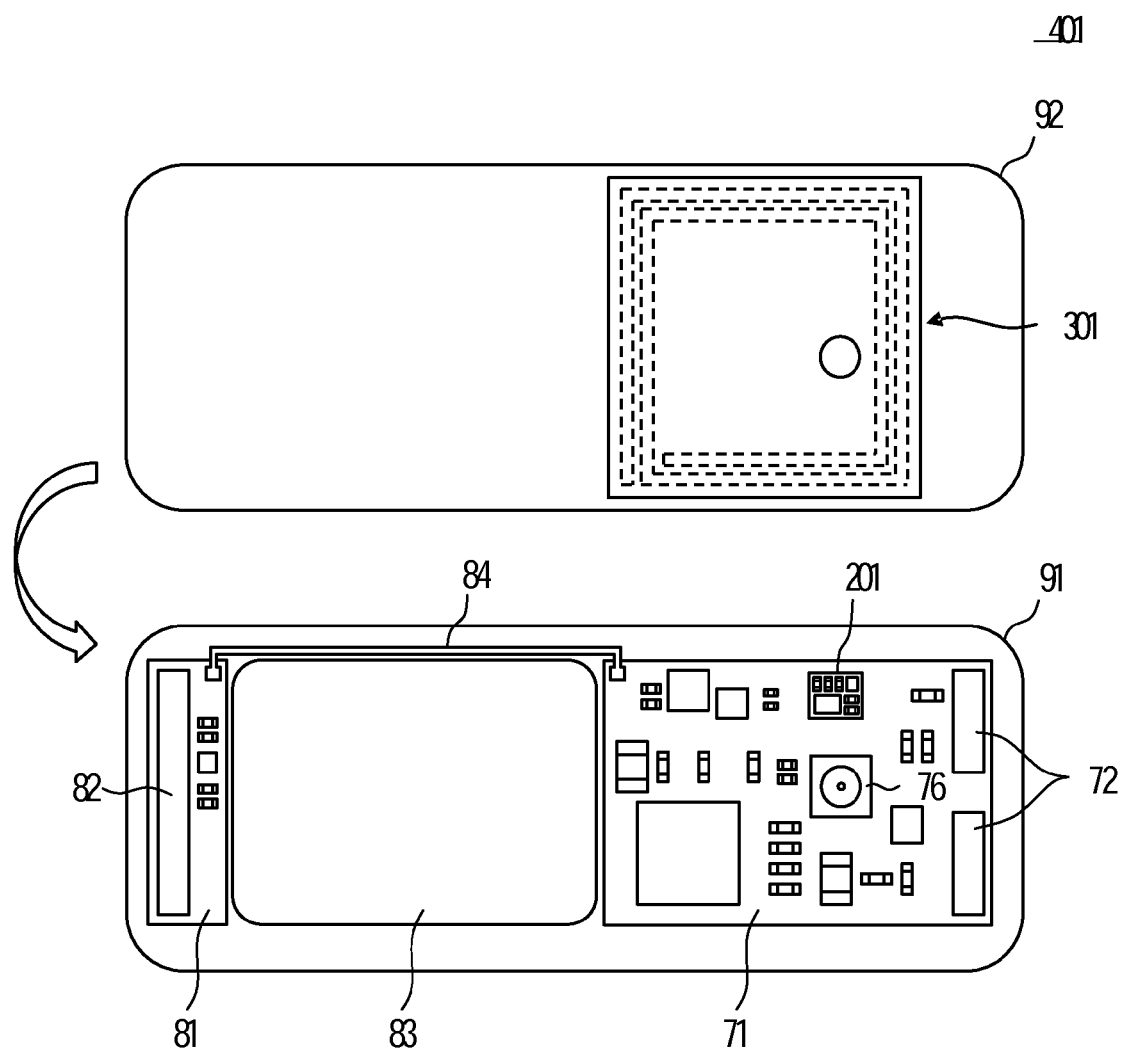
FIG. 35 is a view showing a structure of an inside of a housing of a wireless communication device 401 according to a fourteenth preferred embodiment of the present invention, and is a plan view showing a state in which an upper housing 91 and a lower housing 92 are separated to expose the inside.

FIG. 35 is a view showing a structure of an inside of a housing of a wireless communication device 401 according to a fourteenth preferred embodiment of the present invention, and is a plan view showing a state in which an upper housing 91 and a lower housing 92 are separated to expose the inside. This wireless communication device 401 includes the antenna integrated RF module 201 and the booster coil 301 that are shown in FIG. 30.

The upper housing 91 stores therein printed wiring boards 71 and 81, a battery pack 83, and the like. The printed wiring board 71 includes the antenna integrated RF module 201. The printed wiring board 71 also includes a UHF band antenna 72, a camera module 76, and the like. The printed wiring board 81 includes a UHF band antenna 82 and the like. The printed wiring board 71 and the printed wiring board 81 are connected through a coaxial cable 84.

The lower housing 92 includes a booster coil 301 located on the inner surface thereof. This booster coil 301 is magnetically coupled with the antenna portion (the feeding coil) of the antenna integrated RF module 201.

It is to be noted while each of the above described preferred embodiments has exemplified, in the cross-sectional view after thermocompression bonding, a plurality of the magnetic substance cores 40 are embedded in the cavity without a gap, a very small gap between the magnetic substance core 40 and the inner surface of the cavity may be generated.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
a resin multilayer substrate in which a plurality of resin sheets are laminated to one another; and
a coil conductor located on the resin multilayer substrate; wherein
the resin multilayer substrate includes a cavity inside of the resin multilayer substrate;
the coil conductor is wound around a periphery of the cavity;
the cavity includes a magnetic substance of a sintered body arranged inside the cavity;
the coil conductor includes:
a plurality of linear conductors located on surfaces of the resin sheets in different layers; and
an interlayer connection conductor that connects the linear conductors between the different layers;
the plurality of linear conductors are arranged to cross the magnetic substance in a plan view;
one of the resin sheets includes a portion that is adjacent to the plurality of linear conductors; and
the portion is bent in a corrugated plate shape.

2. The antenna device according to claim 1, wherein
the resin multilayer substrate includes a plurality of the cavities inside of the resin multilayer substrate; and
each of the cavities includes the magnetic substance.

3. The antenna device according to claim 1, further comprising a first conductor pattern other than the coil conductor, wherein
the magnetic substance has a flat plate shape; and
the first conductor pattern is arranged in a position in which at least a portion of at least one of surfaces of the magnetic substance is covered.

4. The antenna device according to claim 3, wherein
the plurality of resin sheets include a resin sheet between the first conductor pattern and the coil conductor; and
the resin sheet has a dielectric constant that is lower than a dielectric constant of the resin sheet on which the coil conductor is located and a dielectric constant of the magnetic substance.

5. The antenna device according to claim 1, further comprising a second conductor pattern, wherein
the magnetic substance has a rectangular or substantially rectangular plate shape; and
the second conductor pattern is arranged in a position in which the second conductor pattern overlaps a short side of the magnetic substance.

6. The antenna device according to claim 5, wherein:
the coil conductor includes:
a plurality of linear conductors located on a surface of the resin sheet in different layers; and an interlayer connection conductor that connects the linear conductors between the layers; and the second conductor pattern is a portion of the linear conductors.

7. The antenna device according to claim 1, wherein the interlayer connection conductor of the resin multilayer substrate is arranged in a periphery of the magnetic substance in a plan view.

8. The antenna device according to claim 1, wherein the resin sheet with which the magnetic substance is temporarily compression bonded before the plurality of resin sheets are laminated includes no coil conductor in a position in which the resin sheet overlaps the magnetic substance in a plan view.

9. The antenna device according to claim 1, wherein, among the plurality of resin sheets, the resin sheet of a layer including the cavity is a sheet including a magnetic substance.

10. The antenna device according to claim 1, further comprising a coil that is electromagnetically coupled to the coil conductor and radiates an electromagnetic field.

11. An antenna device comprising:
a resin multilayer substrate in which a plurality of resin sheets are laminated to one another; and
a coil conductor located on the resin multilayer substrate; wherein
the resin multilayer substrate includes a cavity inside of the resin multilayer substrate;
the coil conductor is wound around a periphery of the cavity;
the cavity includes a magnetic substance of a sintered body arranged inside the cavity;
the resin multilayer substrate includes a chip element mounted on at least one of principal surfaces of the resin multilayer substrate; and
the chip element is connected to the coil conductor.

12. A wireless communication device comprising:
an antenna device including:
a resin multilayer substrate in which a plurality of resin sheets are laminated to one another; and
a coil conductor located on the resin multilayer substrate; wherein
the resin multilayer substrate includes a cavity inside of the resin multilayer substrate;
the coil conductor is wound around a periphery of the cavity;
the cavity includes a magnetic substance of a sintered body arranged inside the cavity;
the coil conductor includes:
a plurality of linear conductors located on surfaces of the resin sheets in different layers; and
an interlayer connection conductor that connects the linear conductors between the different layers;
the plurality of linear conductors are arranged to cross the magnetic substance in a plan view;
one of the resin sheets includes a portion that is adjacent to the plurality of linear conductors; and
the portion is bent in a corrugated plate shape; and
a communication circuit connected to the coil conductor.

13. The wireless communication device according to claim 12, wherein
the resin multilayer substrate includes a plurality of the cavities inside of the resin multilayer substrate; and
each of the cavities includes the magnetic substance.

14. The wireless communication device according to claim 12, further comprising a first conductor pattern other than the coil conductor, wherein the magnetic substance has a flat plate shape; and
the first conductor pattern is arranged in a position in which at least a portion of at least one of surfaces of the magnetic substance is covered.

15. The wireless communication device according to claim 14, wherein
the plurality of resin sheets include a resin sheet between the first conductor pattern and the coil conductor; and
the resin sheet has a dielectric constant that is lower than a dielectric constant of the resin sheet on which the coil conductor is located and a dielectric constant of the magnetic substance.

16. The wireless communication device according to claim 12, further comprising a second conductor pattern, wherein
the magnetic substance has a rectangular or substantially rectangular plate shape; and
the second conductor pattern is arranged in a position in which the second conductor pattern overlaps a short side of the magnetic substance.

17. A method of manufacturing an antenna device including a resin multilayer substrate in which a plurality of resin sheets are laminated to one another, and a coil conductor located on the resin multilayer substrate, the method comprising the steps of:
forming the coil conductor on the resin sheet;
forming an aperture in the resin sheet; and
forming a cavity including a plurality of the apertures laminated by laminating, among the plurality of resin sheets, a resin sheet in which the aperture is formed and a resin sheet in which no aperture is formed, storing in the cavity a magnetic substance of a sintered body having an outer dimension smaller than an inner dimension of the cavity, and compression bonding the plurality of resin sheets together with the magnetic substance.

18. The method of manufacturing an antenna device according to claim 17, further comprising a step of arranging the magnetic substance on the resin sheet in which no aperture is formed and temporarily compression bonding the resin sheet and the magnetic substance before the step of compression bonding the plurality of resin sheets.

19. The method of manufacturing an antenna device according to claim 17, wherein the resin sheet with which the magnetic substance is temporarily compression bonded before the plurality of resin sheets are laminated includes no coil conductor in a position in which the resin sheet overlaps the magnetic substance in a plan view.

20. A wireless communication device comprising:
an antenna device including:
a resin multilayer substrate in which a plurality of resin sheets are laminated to one another; and
a coil conductor located on the resin multilayer substrate; wherein
the resin multilayer substrate includes a cavity inside of the resin multilayer substrate;
the coil conductor is wound around a periphery of the cavity;
the cavity includes a magnetic substance of a sintered body arranged inside the cavity;
the resin multilayer substrate includes a chip element mounted on at least one of principal surfaces of the resin multilayer substrate; and
the chip element is connected to the coil conductor; and
a communication circuit connected to the coil conductor.

* * * * *